(12) United States Patent
Kitsunezuka

(10) Patent No.: US 8,818,317 B2
(45) Date of Patent: Aug. 26, 2014

(54) FREQUENCY CONVERTER AND RECEIVER THAT USES THE FREQUENCY CONVERTER

(75) Inventor: Masaki Kitsunezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 55 days.

(21) Appl. No.: 13/805,593

(22) PCT Filed: Apr. 18, 2011

(86) PCT No.: PCT/JP2011/059512
§ 371 (c)(1),
(2), (4) Date: Dec. 19, 2012

(87) PCT Pub. No.: WO2012/002026
PCT Pub. Date: Jan. 5, 2012

(65) Prior Publication Data
US 2013/0102266 A1 Apr. 25, 2013

(30) Foreign Application Priority Data
Jun. 29, 2010 (JP) ................................. 2010-147497

(51) Int. Cl.
*H03B 1/04* (2006.01)
*H04B 1/10* (2006.01)

(52) U.S. Cl.
USPC ............................. 455/317; 455/326; 331/74

(58) Field of Classification Search
CPC ..................................... H03B 1/04; H03B 1/10
USPC ............ 331/74; 455/255, 256, 257, 258, 313, 455/317, 318, 323
See application file for complete search history.

(56) References Cited

U.S. PATENT DOCUMENTS

| 6,901,248 | B1 | 5/2005 | Cowley |
| 7,509,110 | B2 * | 3/2009 | Hayashi et al. ............... 455/302 |
| 2003/0186669 | A1 | 10/2003 | Yamawaki et al. |
| 2005/0233723 | A1 * | 10/2005 | Gomez et al. .................. 455/323 |
| 2007/0160168 | A1 | 7/2007 | Beukema et al. |
| 2008/0076375 | A1 * | 3/2008 | Cooley et al. ................. 455/313 |
| 2010/0003943 | A1 | 1/2010 | Seendripu et al. |

FOREIGN PATENT DOCUMENTS

| JP | 2001128079 A | 5/2001 |
| JP | 2002198847 A | 7/2002 |
| JP | 2003298441 A | 10/2003 |
| JP | 2004511941 A | 4/2004 |

(Continued)

OTHER PUBLICATIONS

The international search report for PCT/JP2011/059512 mailed on Jul. 12, 2011.
S. Lerstaveesin, et al., "A 48-860 MHz CMOS Low-IF Direct-Conversion DTV Tuner," IEEE J. Solid-State Circuits, vol. 43, No. 9, pp. 2013-2024, Sep. 2008.

(Continued)

*Primary Examiner* — Blane J Jackson
(74) *Attorney, Agent, or Firm* — Sughrue Mion, PLLC

(57) ABSTRACT

The present invention is applied to a frequency converter used for a receiver. The frequency converter according to the present invention includes an LO signal generator (11) that generates an LO signal and outputs the LO signal; and a mixer (10) that multiplies a received signal that has been band-limited in a usable bandwidth of said receiver by the LO signal so as to convert the frequency of the received signal and outputs the resultant signal, wherein said LO signal generator is capable of varying a phase resolution, and said frequency converter is capable of varying a signal gain for each phase value of the LO signal.

10 Claims, 29 Drawing Sheets

(56) References Cited

FOREIGN PATENT DOCUMENTS

| | | |
|---|---|---|
| JP | 2008022187 A | 1/2008 |
| JP | 2008523734 A | 7/2008 |
| JP | 2009523342 A | 6/2009 |
| WO | 0231962 A2 | 4/2002 |

OTHER PUBLICATIONS

Z. Ru, et al., "A Software-Defined Radio Receiver Architecture Robust to Out-of-Band Interference," in IEEE ISSCC Dig. Tech. Papers, 2009, pp. 230-231.

* cited by examiner

Fig.6
(A)
CW1=8
(vary by 90 degrees)
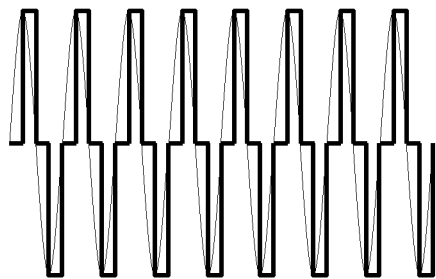
(B)
CW1=4
(vary by 45 degrees)
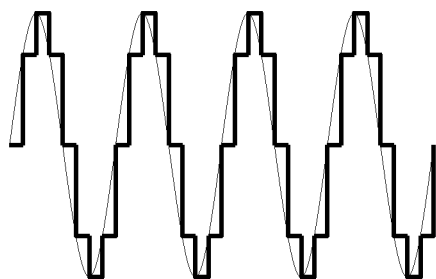
(C)
CW1=2
(vary by 22.5 degrees)
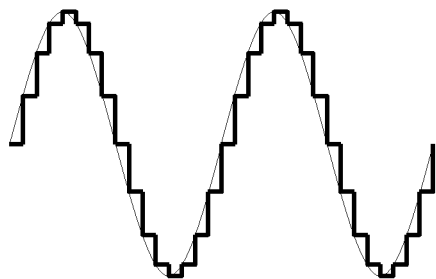
(D)
CW1=1
(vary by 11.25 degrees)
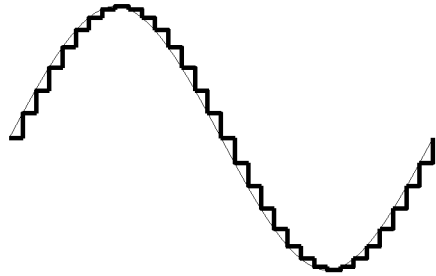

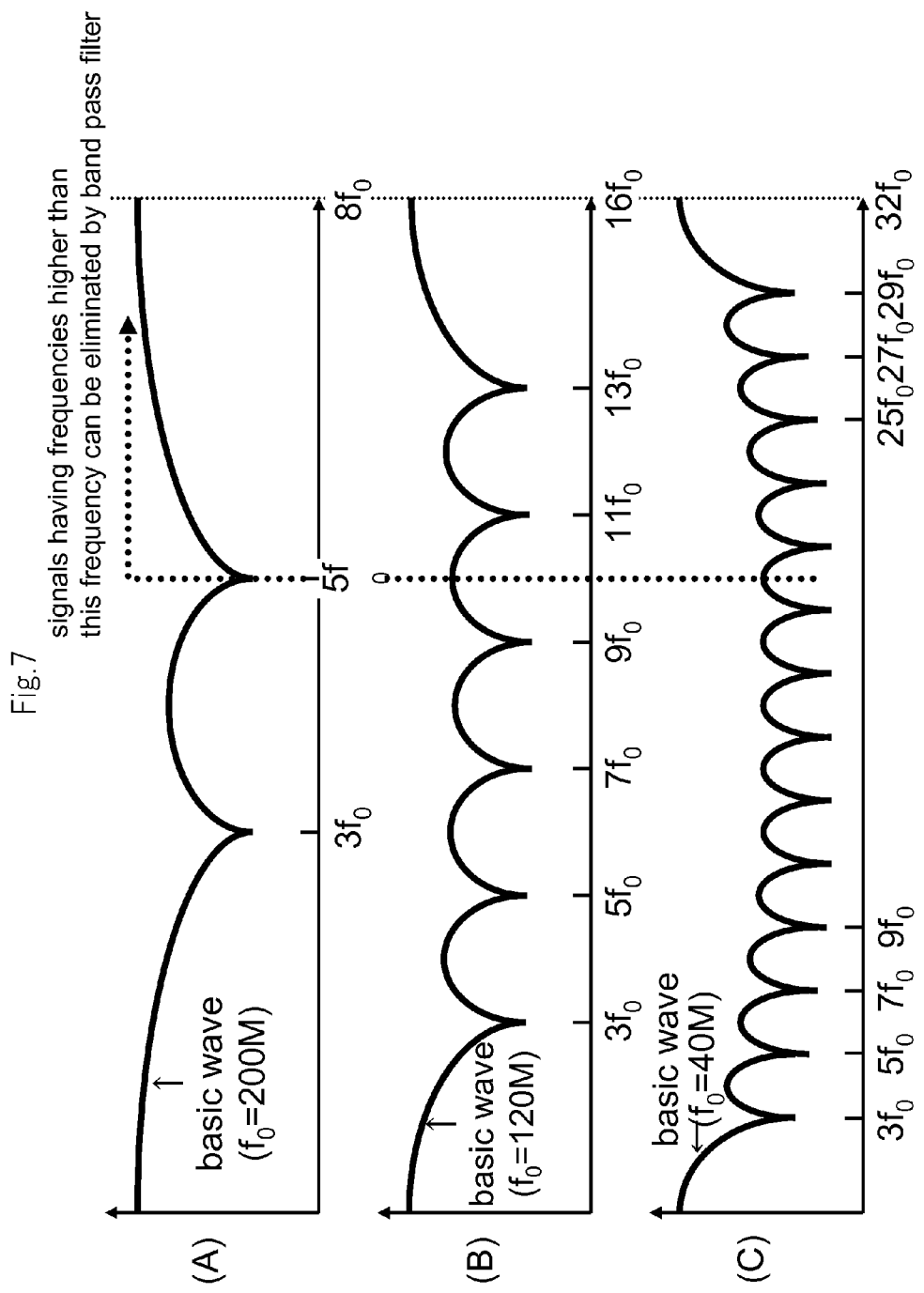

Fig.11
(A)
CW1=8
(vary by 90 degrees)
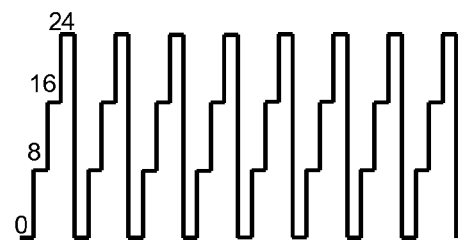
(B)
CW1=4
(vary by 45 degrees)
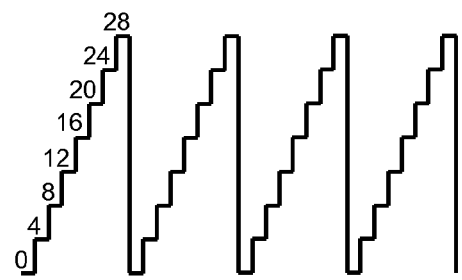
(C)
CW1=2
(vary by 22.5 degrees)
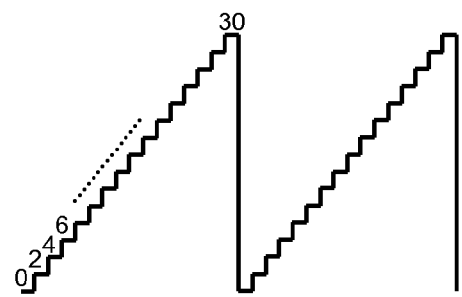
(D)
CW1=1
(vary by 11.25 degrees)
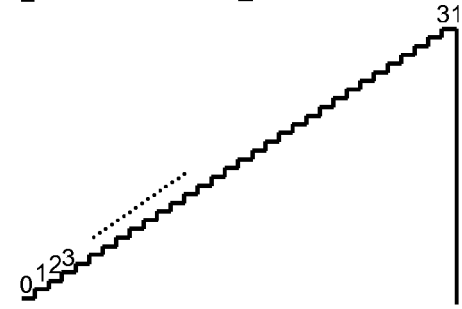

Fig.15
(A)
CW=8
(vary by 90 degrees)
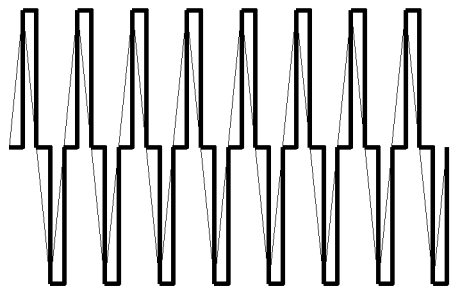
(B)
CW=4
(vary by 45 degrees)
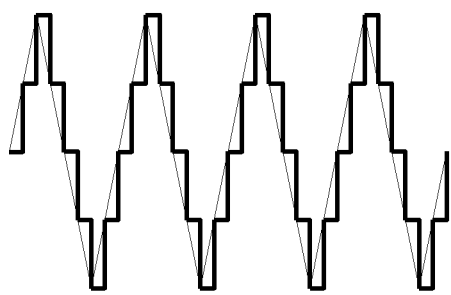
(C)
CW=2
(vary by 22.5 degrees)
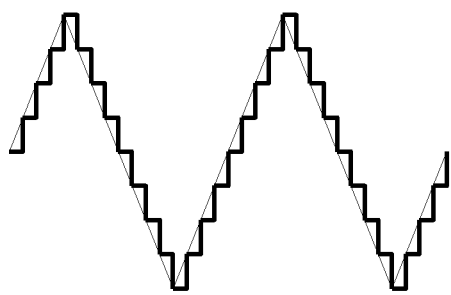
(D)
CW=1
(vary by 11.25 degrees)
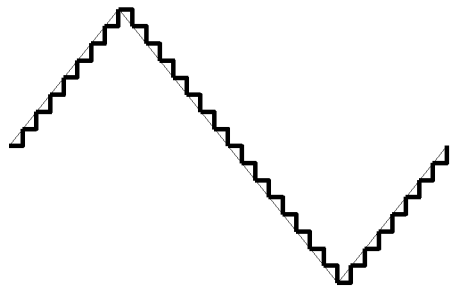

Fig.17
(A)
FCW=8
(vary by 90 degrees)
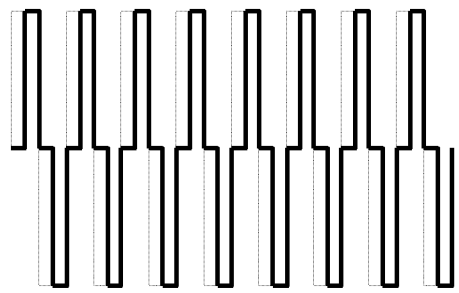
(B)
FCW=4
(vary by 45 degrees)
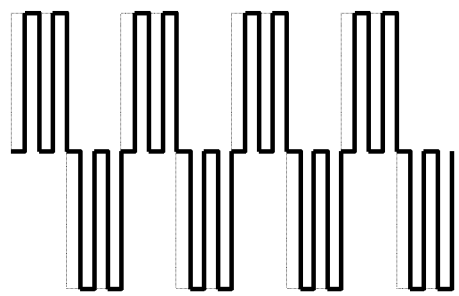
(C)
FCW=2
(vary by 22.5 degrees)
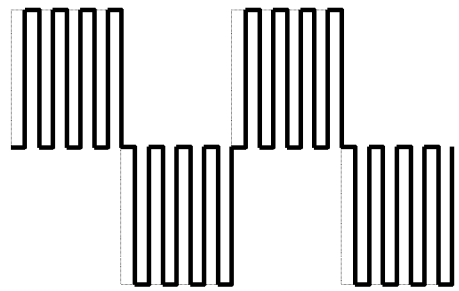
(D)
FCW=1
(vary by 11.25 degrees)
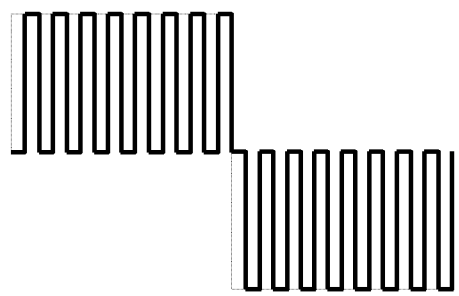

FREQUENCY CONVERTER AND RECEIVER THAT USES THE FREQUENCY CONVERTER

This application is a National Stage Entry of PCT/JP2011/059512 filed Apr. 18, 2011, which claims priority from Japanese Patent Application 2010-147497 filed Jun. 29, 2010, the contents of all of which are incorporated herein by reference, in their entirety.

TECHNICAL FIELD

The present invention relates to a frequency converter and a receiver that uses the frequency converter, in particular, a receiver that can convert the frequency of a desired signal in a wide frequency range while it eliminates interference signals having various frequencies including those of odd-order harmonics of a local oscillation signal of a Local Oscillator (LO) and having various intensities and satisfies requirements for reduced the size of circuit area and reduced the power consumption.

BACKGROUND ART

In recent years, software-defined radios that use general-purpose hardware and that can switch between radio communication standards that only correspond to settings on software have been actively studied and developed. Software-defined radios need to deal with radio frequencies from several 10 MHz to several GHz that are generally used.

FIG. 1 shows the structure of a receiver disclosed in Non-Patent Literature 1 as an example of a receiver that receives RF (Radio Frequency) signals. In this receiver, a received RF signal is input through an antenna to an RF circuit composed of band pass filter 280, low noise amplifier (LNA) 281, RF tracking filter 282, and frequency converter 283. Band pass filter 280 eliminates interference signals that lie in an unnecessary bandwidth from the received RF signal so as to prevent the downstream circuits from getting saturated (however, in this case, band pass filter 280 cannot eliminate interference signals having frequencies that are close to the frequency of the desired signal). The received RF signal that passes through band pass filter 280 is amplified by LNA 281. After RF tracking filter 282 further suppresses the remaining interference signals, frequency converter 283 converts the frequency of the received RF signal using a clock signal generated by clock generator 284, and then a baseband section performs signal processes such as filtering for the resultant signal.

From the point of cost and the size of circuit area for software-defined radios, it is not preferred that components that differ in characteristics be implemented and switched between applicable radio communication standards. In particular, reducing the number of band pass filters that are integrated in a chip is difficult and has become a critical technical issue so as to accomplish software-defined radios. To reduce the number of band pass filters, a technique that allows the pass bandwidth of a band pass filter to become variable or another technique that allows signals having frequencies of several 10 MHz to several GHz to pass may be considered. On the other hand, band pass filters located upstream of the LNA need to satisfy both high linearity and low noise characteristics. Although passive filters such as surface acoustic filters (SAWs) excellently satisfy such characteristics, it is difficult to adjust the pass bandwidth of passive filters.

Thus, in receivers applicable for software-defined radios, SAW filters that have wide pass bandwidths might be a hopeful candidate for band pass filters. However, in this case, depending on the frequency of a desired signal, interference signals having frequencies up to 10 times higher than the frequency of the desired signal could be input to the LNA and the frequency converter. Thus, an RF circuit needs to have high linearity that can stand very strong interference signals. While CMOS process has been miniaturized, power supply voltage has been decreased, and the dynamic range of the RF circuit has been narrowed, accomplishing high linearity has become a very important technical issue.

As a technical issue for frequency converters, interference signals having frequencies that are close to high order harmonics of an LO signal are frequency-converted into baseband signals along with the desired signal because of harmonics of the LO signal and nonlinearity of a mixer. Such interference signals cannot be eliminated by ordinary frequency converters that have dull frequency characteristics and thereby they can narrow the dynamic range. In particular, if the LO frequency of the LO signal is low, it is difficult to transmit the LO signal as a sine wave. Rather, it would be advantageous to transmit the LO signal as a square wave from a point of reduced the size of circuit area and reduced power consumption. However, since an LO signal having a square waveform contains many odd-order harmonics, the lower the LO frequency, the more the foregoing issue becomes serious. On the other hand, although a receiver that has a differential structure can eliminate interference signals having frequencies of even-order harmonics of the LO signal, if the differential structure is asymmetrical, it would become difficult to sufficiently suppress interference signals. As a result, in this situation, the dynamic range would be narrowed.

The receiver disclosed in Non-Patent Literature 1 uses both a mixer (FIG. 2) called harmonics eliminating mixer located in frequency converter 283 and RF tracking filter 282 so as to solve the foregoing problem. The harmonics eliminating mixer uses a three-phase square LO signal having phases that vary by 45 degrees each. For example, a base band signal having a phase of 0 degree (hereinafter referred to as base band I signal) is obtained by multiplying the received RF signal by an LO signal having phases of −45 degrees, 0 degree, and 45 degrees, weighting the results with gains of 1, $\sqrt{2}$, and 1, respectively, and adding the results. A base band signal having a phase of 90 degrees (hereinafter referred to as base band Q signal) can be obtained by multiplying the received RF signal by an LO signal having phases of 45 degrees, 90 degrees, and 135 degrees, respectively, weighting them with the foregoing gains, and adding the results. Likewise, inverted signals of base band I signal and base band Q signal can be obtained by using an LO signal having phases of 135 degrees, 180 degrees, and 225 degrees and an LO signal having phases of 225 degrees, 270 degrees, and 315 degrees, respectively. In other words, to demodulate base band I signal and base band Q signal, an LO signal having a total of eight phases that vary by 45 degrees each is used. By weighting an LO signal having phases that vary by 45 degrees each and adding the results, the frequency conversion gain of frequency converter 283 becomes $(1+\sqrt{2}\cdot z^{-1}+z^{-2})$ where $z^{-1}$ is a time delay corresponding to a phase of 45 degrees of the LO signal. Thus, frequency converter 283 has a finite impulse response (FIR) filter characteristic of three taps $(1+\sqrt{2}\cdot z^{-1}+z^{-2})$. The standardized frequency of the FIR filter is eight times higher than the LO frequency. The FIR filter has zero gain points at frequencies that are three times and five times higher than the LO frequency. As a result, the FIR filter can eliminate interference signals having frequencies that are three times and five times higher than the LO frequency (FIG. 3).

As another example, FIG. 4 shows a frequency converter (Patent Literature 1). The frequency converter has a generalized harmonics eliminating mixer that can eliminate higher order harmonics than the harmonics eliminating mixer shown in FIG. 2. The harmonics eliminating mixer disclosed in Patent Literature 1 is driven with discrete LO signals that are shifted by different angles from a common LO signal. The harmonics eliminating mixer has ($2^{w-1}-1$) discrete mixers (($2n+1$) discrete mixers in FIG. 4) such that output signals of the individual discrete mixers are added and output. Since the gain in which output signals of the individual mixers are weighted and added is proportional to cosine values corresponding to the phases of the individual LO signals, interference signals having frequencies of odd-order harmonics, up to ($2^w-3$)-th order harmonics, of the LO signal can be eliminated.

RELATED ART LITERATURE

Patent Literature

Patent Literature 1: JP2008-523734A, publication (translated version)

Non-Patent Literature

Non-Patent Literature 1: S. Lerstaveesin, et al., "A 48-860 MHz CMOS Low-IF Direct-Conversion DTV Tuner," IEEE J. Solid-State Circuits, vol. 43, no. 9, pp. 2013-2024, September 2008.

SUMMARY OF THE INVENTION

Problem to be Solved by the Invention

However, the frequency converter and receiver disclosed in Non-Patent Literature 1 have several problems.

As a first problem, even if the frequency of the desired signal is low and interference signals having frequencies higher than or equal to those of seventh-order or harmonic of the LO signal narrow the dynamic range of the RF circuit of the receiver, such interference signals cannot be eliminated. Alternatively, since interference signal having frequencies that are apart from those of the third-order and fifth-order harmonics cannot be sufficiently suppressed, such interference signals narrow the dynamic range of the RF circuit. To solve such a problem, an RF tracking filter whose center frequency matches the frequency of the desired signal is located upstream of the frequency converter so as to eliminate the interference signals. However, if passive filters are used for the RF tracking filter, their circuit area might become a problem; if active filters are used for the RF tracking filter, their power consumption might become a problem. Conversely, even if the frequency of the desired signal is low, unless interference signals occur, a harmonics eliminating receiver using multi-phase LO signals might be rather unnecessary because the generation of the multi-phase LO signals wastes power.

As a second problem, if the frequency of the desired signal is relatively high and an interference signal having a frequency three times higher than the frequency of the desired signal has been eliminated by an upstream band pass filter, a harmonics eliminating mixer using an LO signal having eight or more phases is rather unnecessary because the generation of multi-phase LO signal and the operation of the RF tracking filter waste power.

Likewise, since the receiver having the frequency converter disclosed in Patent Literature 1 does not have an optimum structure that deals with the frequency of an expected desired signal and the frequencies and intensities of interference signals, the receiver also has a similar problem. However, Patent Literature 1 does not disclose a technique that solves such a problem.

Therefore, an object of the present invention is to provide a frequency converter that can convert the frequency of a desired signal in a wide frequency range while it eliminates interference signals that have various frequencies including those of odd-order frequencies of an LO signal and that have various intensities, and satisfies requirements for reduced the size of circuit area and reduced power consumption.

Another object of the present invention is to provide a receiver that can receive a desired signal in a wide frequency range while it eliminates interference signals that have various frequencies including those of odd-order harmonics of an LO signal and that have various intensities, and satisfies requirements for reduced the size of circuit area and reduced power consumption without need to use an RF tracking filter.

Means that Solve the Problem

A frequency converter according to the present invention is a frequency converter used for a receiver, comprising:

an LO signal generator that generates an LO signal and outputs the LO signal; and a mixer that multiplies a received signal that has been band-limited in a usable bandwidth of said receiver by the LO signal so as to convert the frequency of the received signal and outputs the resultant signal, wherein said LO signal generator is capable of varying a phase resolution, and wherein said frequency converter is capable of varying a signal gain for each phase value of the LO signal.

A receiver according to the present invention is a receiver, comprising:

a frequency converter as set forth in claim 1 to 9; and a band pass filter that is located upstream of said frequency converter and that limits the bandwidth of the received signal to said usable bandwidth.

Effect of the Invention

A frequency converter according to the present invention has an LO signal generator and a mixer that multiplies a received signal band-limited in the usable bandwidth of a receiver by an LO signal, converts the frequency of the received signal, and outputs the resultant signal. The frequency converter can vary the phase resolution of the LO signal generator and vary a signal gain for each phase value of the LO signal.

Thus, if the LO frequency is low, the usable bandwidth of the receiver contains many harmonics of the LO signal, and the intensities of interference signals that are frequency-converted are high, a precise phase resolution can be designated so as to accomplish an FIR filter characteristic having high order harmonics. Thus, as an effect of the present invention, interference signals having frequencies that are close to those of harmonics of the LO signal can be suppressed without need to use an RF tracking filter that requires large power consumption and large circuit area.

If there is an occurrence of a very strong interference signal having a particular frequency, the signal gain of the frequency converter is controlled such that the frequency conversion gain at the frequency becomes sufficiently low. Thus, as an effect of the present invention, the output signal of the frequency converter can be prevented from being saturated with the interference signal. Conversely, if there is not an occurrence of interference signal, since the phase resolution can be kept coarse, an LO signal can be generated with the minimum phase resolution. Thus, as an effect of the present invention, power consumption for the LO signal can be suppressed.

If the LO frequency is high, there are a few harmonics of the LO signal in the usable bandwidth of the receiver, and the intensities of interference signals that are frequency-converted are low, and since a coarse phase resolution can be designated and an FIR filter characteristic having low order harmonics can be accomplished, as an effect of the present invention, the power consumption for the LO signal can be suppressed.

BRIEF DESCRIPTION OF DRAWINGS

FIG. 6 is a schematic diagram exemplifying a waveform of an LO signal for the frequency converter according to the first exemplary embodiment of the present invention.

FIG. 7 is a schematic diagram exemplifying a frequency characteristic of the frequency converter according to the first exemplary embodiment of the present invention.

FIG. 11 is a schematic diagram showing waveforms of signals that are output from a phase counter according to the first exemplary embodiment of the present invention.

FIG. 15 is a schematic diagram further exemplifying waveforms of LO signals of the frequency converter according to the first exemplary embodiment of the present invention.

FIG. 17 is a schematic diagram further exemplifying waveforms of LO signals of the frequency converter according to the first exemplary embodiment of the present invention.

BEST MODES THAT CARRY OUT THE INVENTION

Figure 1:
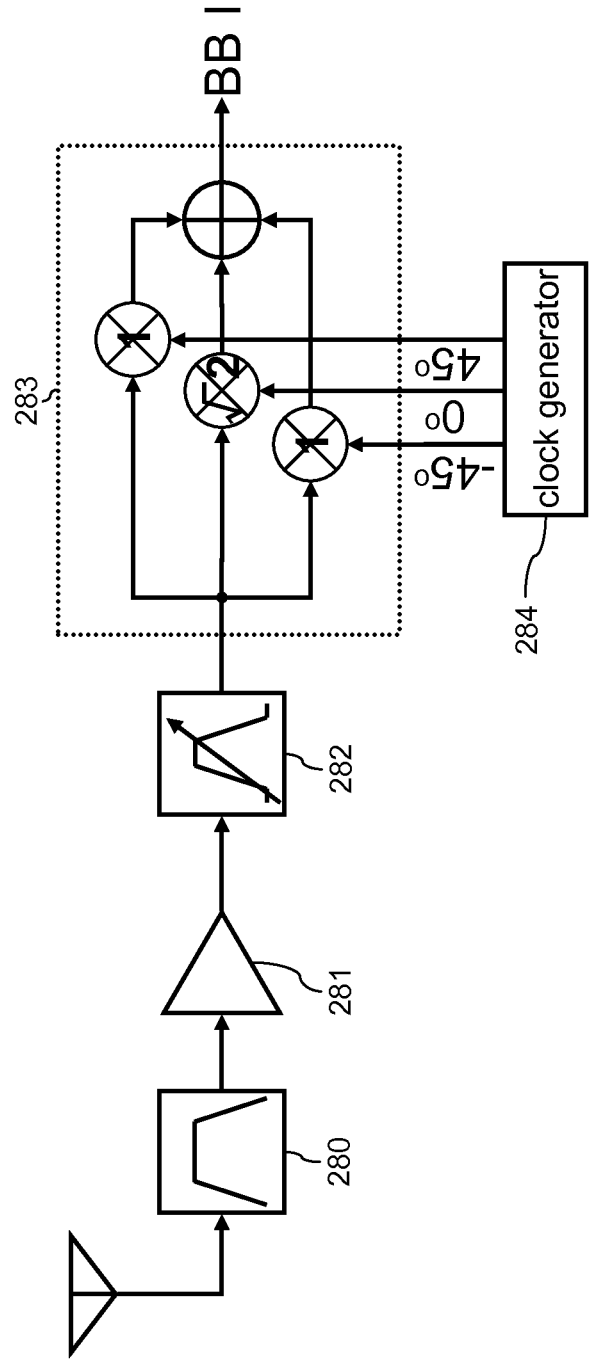
FIG. 1 is a schematic diagram showing the structure of a receiver disclosed in Non-Patent Literature 1.
Figure 2:
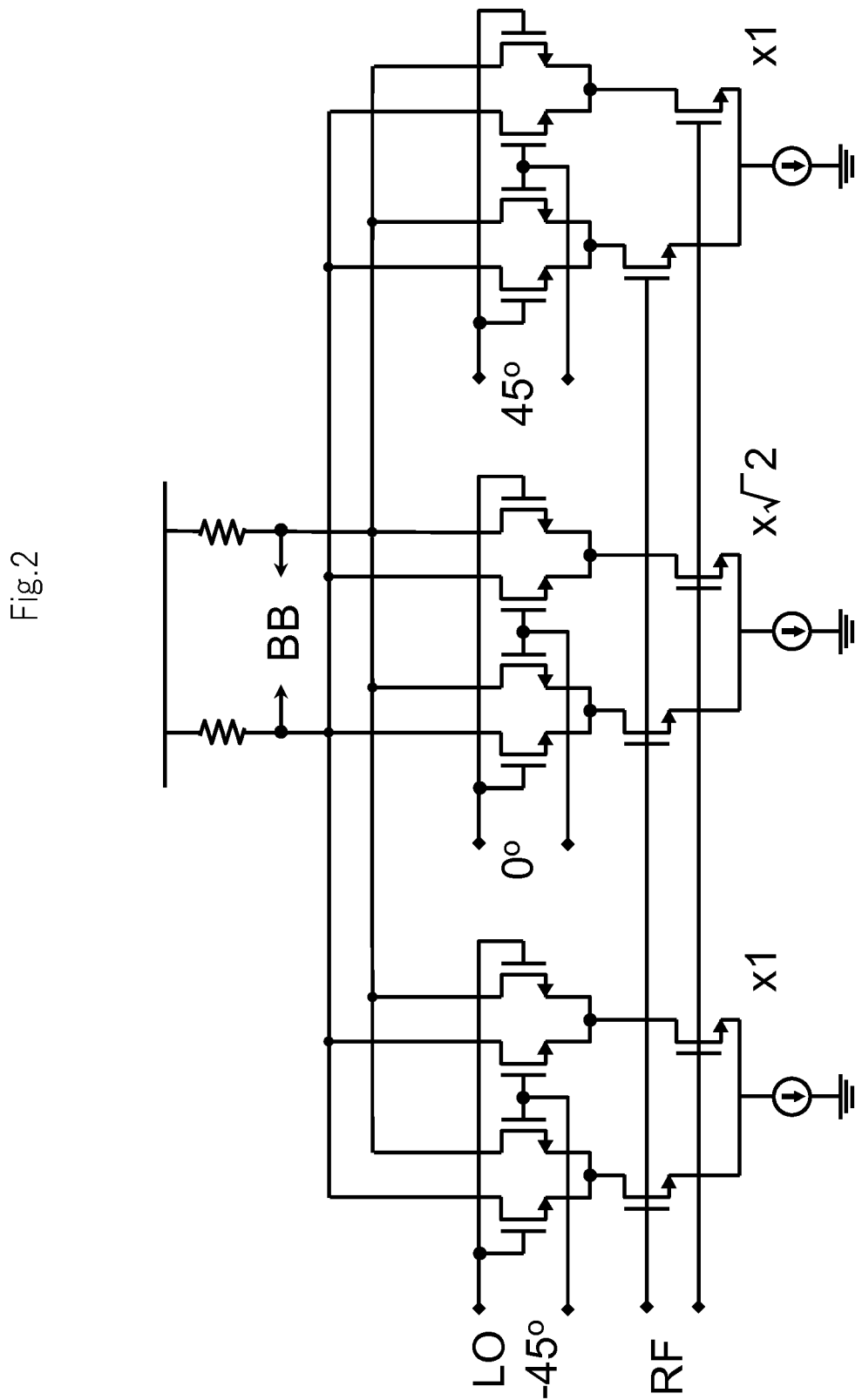
FIG. 2 is a schematic diagram showing the structure of a mixer disclosed in Non-Patent Literature 1.
Figure 3:
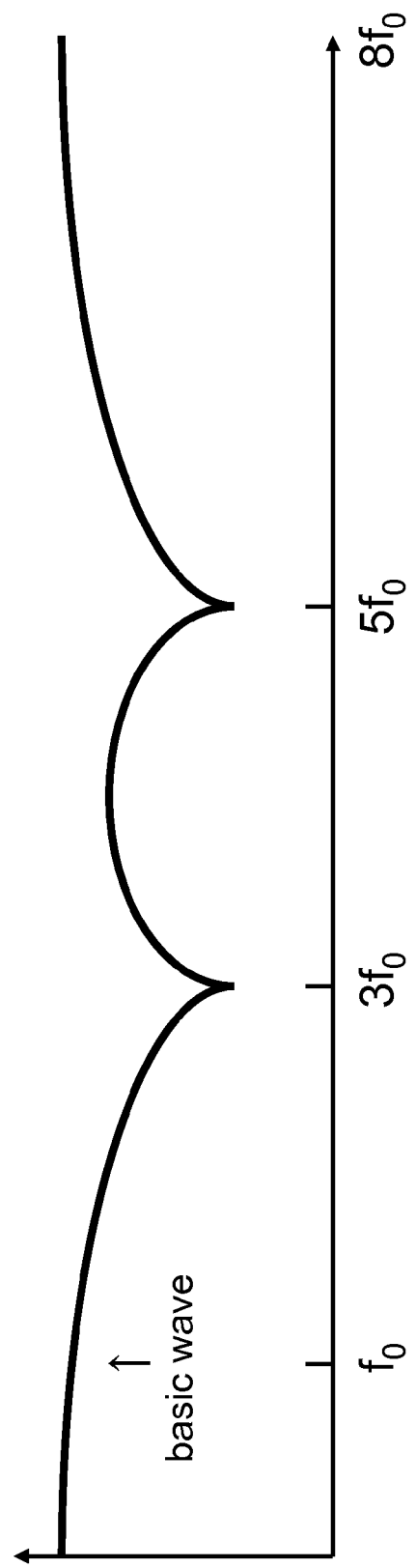
FIG. 3 is a schematic diagram showing a waveform of a signal that is output from a frequency converter disclosed in Non-Patent Literature 1.
Figure 4:
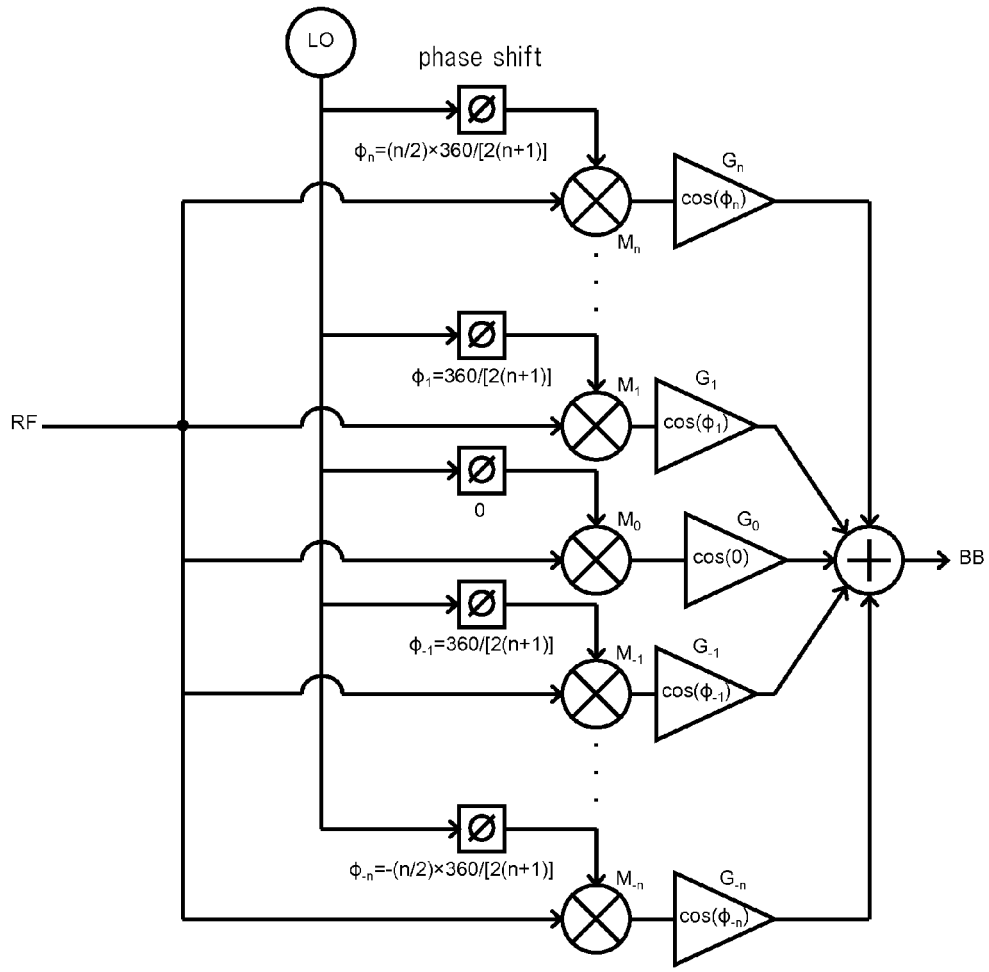
FIG. 4 is a schematic diagram showing the structure of a frequency converter disclosed in Patent Literature 1.

Next, with reference to the accompanying drawings, exemplary embodiments of the present invention will be described in detail. In all the accompanying drawings, similar structural elements are denoted by similar reference numerals and their description will be omitted.

(1) First Exemplary Embodiment

Figure 5:
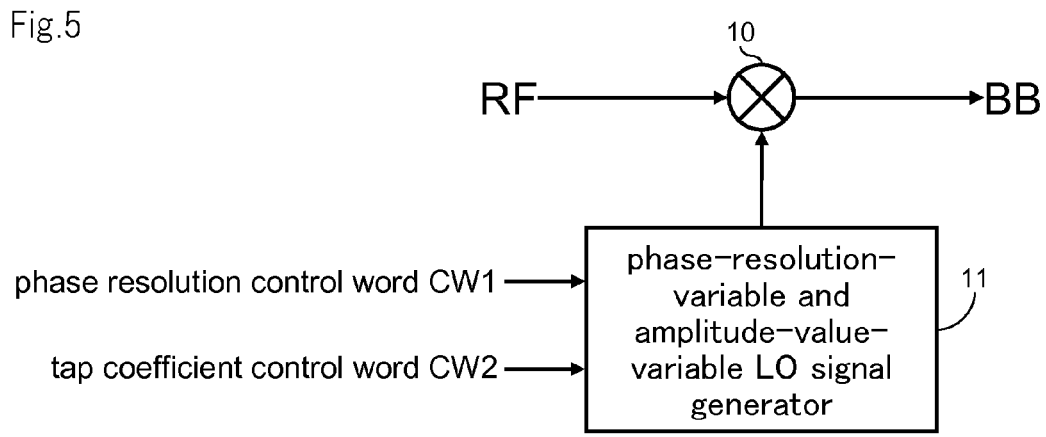
FIG. 5 is a schematic diagram showing the structure of a frequency converter according to a first exemplary embodiment of the present invention.

FIG. 5 shows the structure of a frequency converter according to a first exemplary embodiment of the present invention. The frequency converter according to this exemplary embodiment has mixer 10 and phase-resolution-variable and amplitude-value-variable LO signal generator 11 (hereinafter simply referred to as "LO signal generator" 11) that generates an LO signal having a variable phase resolution and a variable amplitude value for each phase value of the LO signal.

The frequency converter according to this exemplary embodiment is a fundamental circuit that composes an ordinary receiver. The bandwidth of a received RF signal that is input to mixer 10 has been band-limited in the usable bandwidth of the receiver by an upstream band pass filter (not shown) such as a SAW filter such that the filter has eliminated interference signals that lie out of the usable bandwidth of the receiver.

Mixer 10 multiplies the received RF signal that has been band-limited in the foregoing manner by an orthogonal LO signal that is output from LO signal generator 11 so as to convert the frequency of the received RF signal to orthogonal base band signals (base band I signal and base band Q signal).

As orthogonal LO signals, LO signal generator 11 generates waveforms that have a phase resolution decided based on an LO frequency (that is the frequency of an LO signal) and an amplitude value decided such that the frequency conversion gain of the frequency converter becomes low at the frequencies of interference signals that are to be eliminated.

Phase resolution control word (hereinafter simply referred to as "control word") CW 1 that is input to LO signal generator 11 corresponds to a first control signal that causes the phase resolution of LO signal generator 11 to vary.

On the other hand, tap coefficient control word (hereinafter simply referred to as "control word") CW 2 corresponds to a second control signal that causes the signal gain of the frequency converter for each phase value of the LO signal to vary.

In this specification, it is assumed that the signal gain of the frequency converter for each phase value of the LO signal represents the gain of the frequency converter for each phase value to which the phase of the LO signal is shifted, namely the gain at a particular moment of the frequency converter (in a shorter time scale than the LO period of the LO signal). In contrast, the frequency conversion gain of the frequency converter represents the average gain of the frequency converter in a longer time scale (a sufficiently longer scale than the LO period of the LO signal).

In the following description, it is assumed that the frequency converter according to the present invention is applied to a receiver having a direct conversion type reception architecture. In addition, it is assumed that the frequency of a desired signal (that is the frequency of a desired signal containing desired information of frequencies in the usable bandwidth of the receiver) is the same as the LO frequency and that the desired signal whose frequency has been converted is a base band signal that is mainly composed of a DC. However, the frequency converter according to the present invention uses an LO signal having an LO frequency that is slightly different from the frequency of a desired signal, the frequency converter can be applied to receivers having various architectures that convert the frequency of a band-limited signal such as a low intermediate frequency type receiver that converts the frequency of a desired signal to a signal having a sufficiently lower intermediate frequency and a double super heterodyne type receiver that performs frequency conversion twice.

Next, the operation of the frequency converter according to this exemplary embodiment will be described with a specific numerical example.

In this example, as a numerical example, it is assumed that the usable bandwidth of the receiver ranges from 40 MHz to 1000 MHz and that the received RF signal that is input to mixer 10 has been band-limited in the usable bandwidth by an upstream band pass filter. In other words, up to 25-th order (=1000/40) harmonics need to be considered as harmonics of an LO signal. Thus, $N_0$ that satisfies $(2N_0-3)=25$ becomes 14. To allow the frequency converter to be easily designed, it is preferred that $N_0$ be an integer. If $N_0$ becomes a terminating decimal or a repeating decimal, $N_o$ needs to be integer N greater than the terminating decimal or repeating decimal. More preferably, if N is a power of 2, the circuit structure becomes simple. Thus, in this numerical example, taking account of more higher order harmonics, it is assumed that N=16 ($=2^4$). At this point, the phase resolution of LO signal generator 11 becomes 11.25 degrees (=180 degrees/16). The tap coefficients of a realistic FIR filter become 15 (=16-1) taps.

Next, the operation of the frequency converter according to this exemplary embodiment for various frequencies of a desired signal will be described. In this example, it is assumed that the received RF signal lies in the usable bandwidth of the receiver and interference signals having frequencies of those of odd-order harmonics (3rd order harmonic, 5th order harmonic, 7th order harmonic, 9th order harmonic, ... ) of the LO signal need to be eliminated.

For example, if the frequency of the desired signal is 400 MHz, the frequency three times higher than 400 MHz is 1200 MHz. However, since an interference signal having a frequency of 1200 MHz has been eliminated, even if the LO signal is a square wave and contains many third-order components, no problem will occur in the frequency converter. Thus, $(2N_0-3)=0$, $N_0=1.5$, N=2 ($=2^1$), and phase resolution=90 degrees (=180 degrees/2) are obtained. As shown in FIG. 6(A), the waveform of the LO signal has a total of four phases that vary by 90 degrees each. At this point, the amplitude value of the LO signal for each phase value is proportional to the cosine value. The amplitude value for each phase value of the waveform of the LO signal is 1 (=cos(0°)) between 0~90 degrees, 0 (=cos(90°)) between 90~180 degrees, −1 (=cos(−180°)) between 180~270 degrees, and 0 (=cos(270°)) between 270~360 degrees.

If the frequency of the desired signal is 200 MHz, interference signals having frequencies of 600 MHz and 1000 MHz that are three times and five times higher than 200 MHz have not been eliminated. Thus, an interference signal having frequencies of third order harmonic and fifth order harmonic of the LO signal becomes a critical problem. Thus, $(2N_0-3)=5$, $N_0=4$, N=4 ($=2^2$), and phase resolution=45 degrees (=180 degrees/4) are obtained. Consequently, as shown in FIG. 6(B), the waveform of the LO signal has a total of eight phases that vary by 45 degrees each. The tap coefficients become (=4-1) taps. The characteristic of 3-tap FIR filter of the frequency converter can be expressed by a transfer function given by the following Formula (1).

$$H_3(z^{-1})=\cos(-45°)+z^{-1}\cos(0°)+z^{-2}\cos(45°) \qquad \text{[Formula 1]}$$

where $z^{-1}=\exp(j\times 2\pi f/N/f_{LO})$, f is the frequency, and $f_{LO}$ is the LO frequency. The frequency characteristic of the frequency converter is shown in FIG. 7(A).

If the frequency of the desired signal is 120 MHz, N=8 ($=2^3$) and phase resolution=22.5 degrees (=180 degrees/8) are obtained. Thus, as shown in FIG. 6(C), the waveform of the LO signal has a total of 16 phases that vary by 22.5 degrees each. The tap coefficients become 7 (=8-1) taps. The characteristic of the 7-tap FIR filter can be expressed by a transfer function given by the following Formula (2). The frequency characteristic is shown in FIG. 7(B).

$$H_7(z^{-1})=\cos(-67.5°)+z^{-1}\cos(-45°)+z^{-2}\cos(-22.5°)+$$
$$z^{-3}\cos(0°)+z^{-4}\cos(22.5°)+z^{-5}\cos(45°)+z^{-6}\cos(67.5°)$$ [Formula 2]

If the frequency of the desired signal is 40 MHz, N=16 (=$2^4$) and phase resolution=11.25 degrees (=180 degrees/16) are obtained. Thus, the waveform of the LO signal has a total of 32 phases that vary by 11.25 degrees each. In addition, the tap coefficients become 15 (=16−1) taps. Thus, as shown in FIG. 6(D), the characteristic of the 15-tap FIR filter can be expressed by a transfer function given by the following Formula (3). The frequency characteristic is shown in FIG. 7(C).

$$H_{15}(z^{-1})=\cos(-78.75°)+z^{-1}\cos(-67.5°)+z^{-2}\cos(-56.25°)+\ldots+z^{-13}\cos(67.5°)+z^{-14}\cos(-78.75°)$$ [Formula 3]

As described above, in the frequency converter according to this exemplary embodiment, zero points of the FIR filter lie at any odd-order harmonics of the LO signal in the usable bandwidth of the receiver regardless of the frequency of the desired signal.

Thus, since the receiver does not need an RF tracking filter that suppresses interference signals having frequencies of the seventh or higher odd-order harmonics of the LO signal, the size of circuit area and power consumption for the RF tracking filter can be reduced. If the LO frequency is relatively high and an interference signal having a frequency that is three times higher than the LO frequency has been eliminated, since a coarse phase resolution of the LO signal can be designated, the LO signal is always generated with minimum phase resolution. Thus, since it is not necessary to generate an LO signal having many phases, the power consumption of LO signal generator 11 can be suppressed. Unlike the receiver and frequency converter disclosed in Non-Patent Literature 1 and Patent Literature 1 respectively, since only one mixer is used instead of many discrete mixers, the size of circuit area of the receiver can be reduced.

Figure 8A:
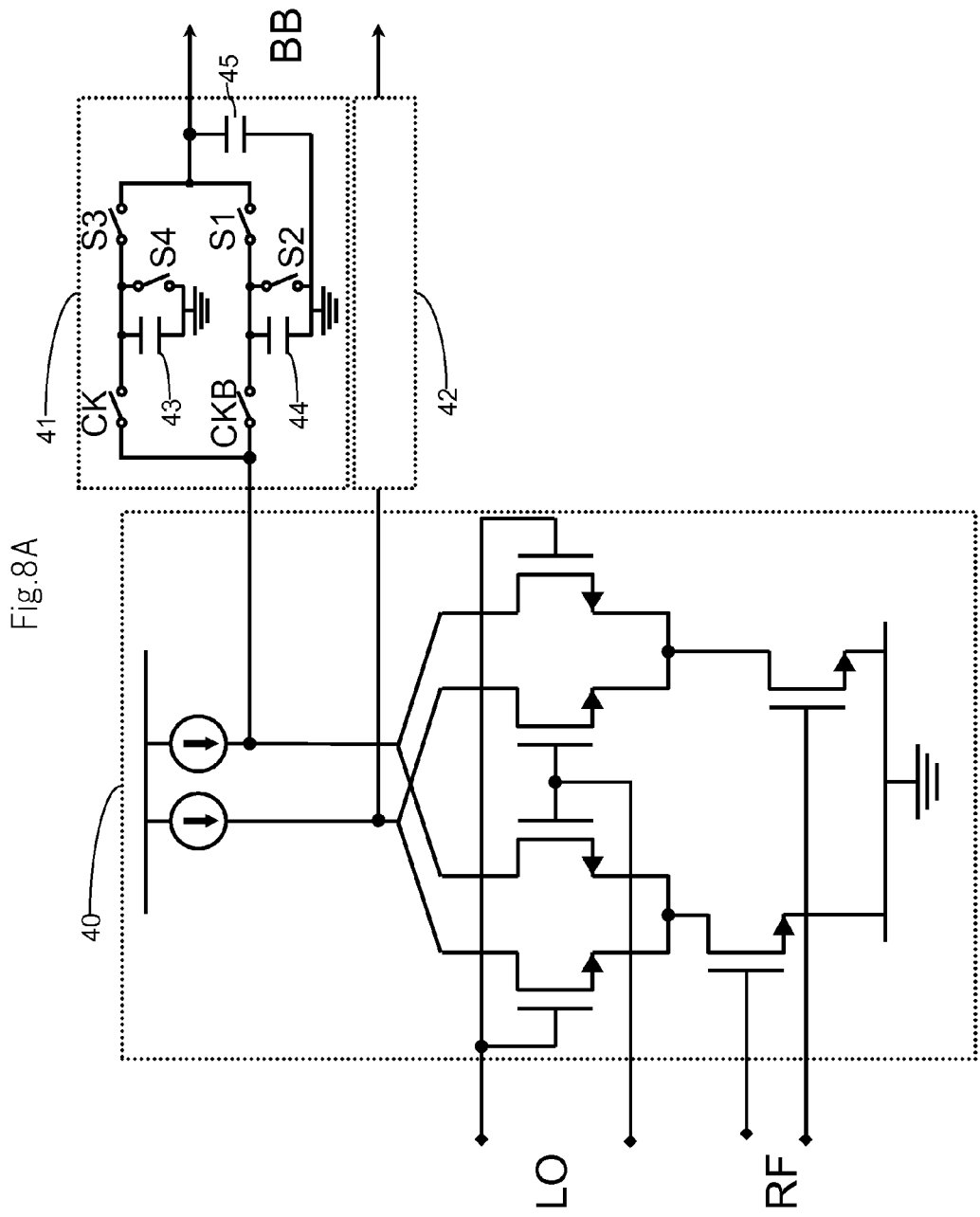
FIG. 8A is a schematic diagram exemplifying a specific structure of a circuit of a mixer according to the first exemplary embodiment of the present invention.
Figure 8B:
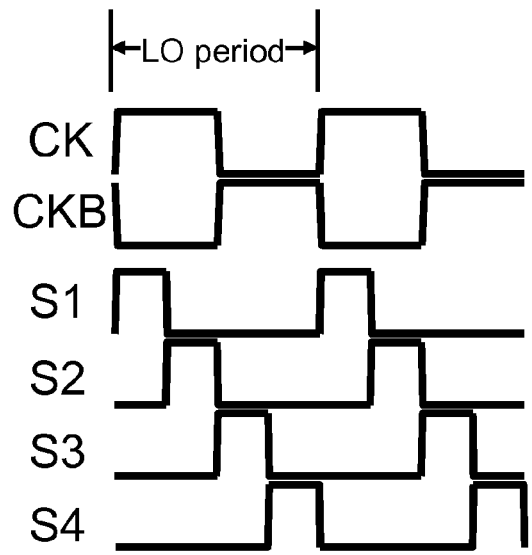
FIG. 8B is a timing chart of a clock that drives the mixer according to the first exemplary embodiment of the present invention.

FIG. 8A shows a specific example of a circuit of mixer 10 according to this exemplary embodiment. Mixer 10 is composed of Gilbert cell mixer 40 loaded by current sources; and switched capacitor sections 41 and 42. Gilbert cell mixer 40 is a mixer ordinarily used for an RF circuit. A waveform (in this numerical example of this exemplary embodiment, a cosine wave or a sine wave) generated by LO signal generator 11 is input to LO signal input terminals. It is preferable that the amplitude of the LO signal be as large as possible unless the linearity of mixer 10 has deteriorated. Gilbert cell mixer 40 outputs frequency-converted base band signals that are current signals to switched capacitor sections 41 and 42 that are connected as loads. Switched capacitor sections 41 and 42 are driven by clock signals CK, CKB, S1, S2, S3, and S4 that are represented in a timing chart shown in FIG. 8B. Here, the operation of switched capacitor section 41 will be described. While CK lies in the high level for a half LO period, a current signal that is output from Gilbert cell mixer 40 is charted to capacitor 43. When S3 becomes the high level, electric charge charged in capacitor 43 and electric charge charged in capacitor 45 are shared therebetween. When S4 becomes the high level, electric charge charged in capacitor 43 is dumped to a ground terminal. As a result, mixer 10 returns to the initial state. While CKB lies in the high level, the same signal process is performed for capacitor 44. If the capacity of capacitors 43 and 44 is sufficiently larger than that of capacity 45, a voltage value in which a current that is output from Gilbert cell mixer 40 is integrated for a half LO period is obtained from an output terminal connected to capacitor 45. The operation of switched capacitor section 42 is the same as that of switched capacitor section 41. As a result, in addition to the characteristic of the FIR filter given by Formulas (1), (2), and (3), sinc filtering by integration of a current for a half LO period can be accomplished.

Figure 9:
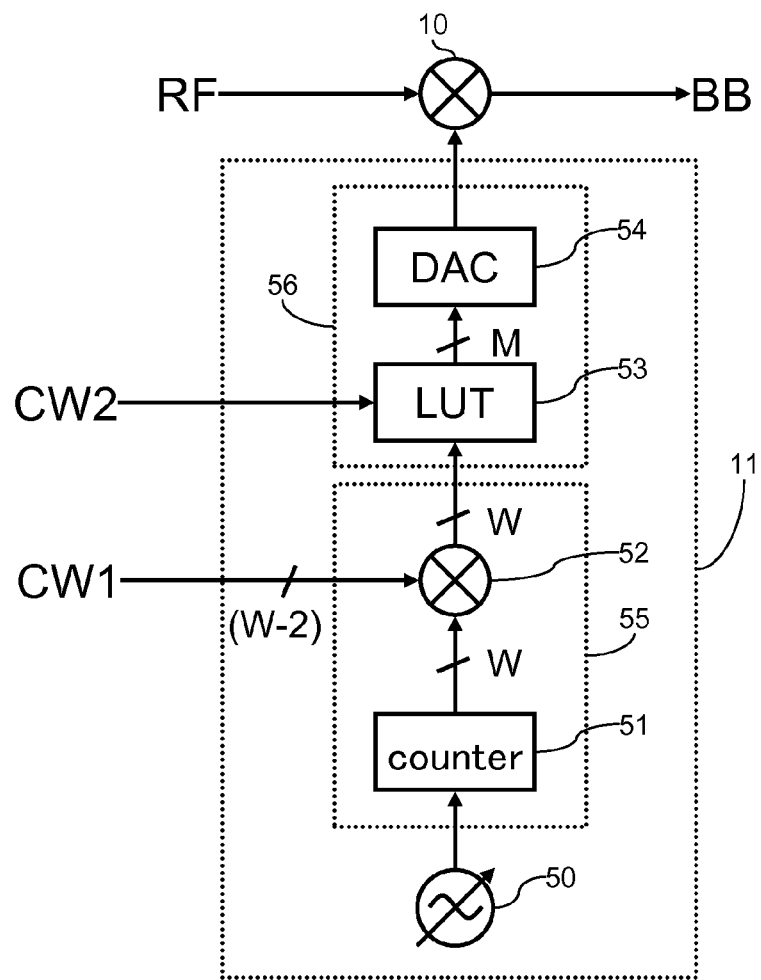
FIG. 9 is a schematic diagram exemplifying a specific structure of an LO signal generator according to the first exemplary embodiment of the present invention.

FIG. 9 shows a specific example of the structural of LO signal generator 11 according to this exemplary embodiment. LO signal generator 11 has variable frequency oscillator 50; phase counter 55 that outputs a phase value corresponding to both the output signal of variable frequency oscillator 50 and control word CW1; and phase-to-amplitude value converter 56 that outputs an LO signal that is an amplitude value corresponding to the phase value that is output from phase counter 55 and control word CW2 to mixer 10. Phase counter 55 is composed of counter 51 and multiplying unit 52. Phase-to-amplitude value converter 56 is composed of lookup table (LUT) 53 and digital-to-analog converter (DAC) 54.

Figure 10:
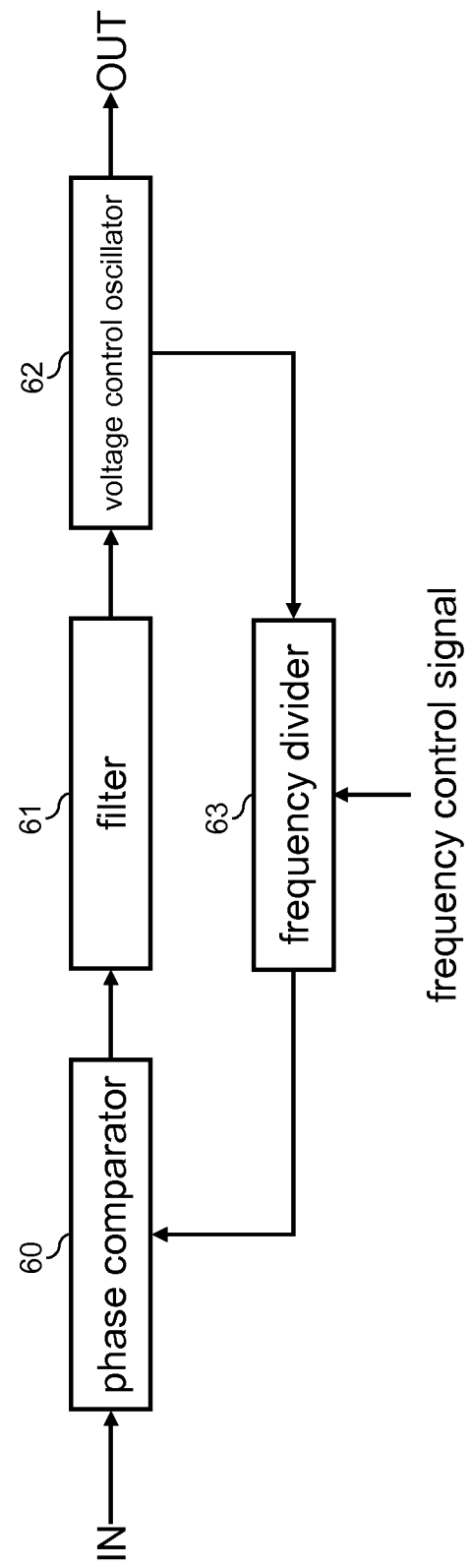
FIG. 10 is a schematic diagram exemplifying a specific structure of a variable frequency oscillator according to the first exemplary embodiment of the present invention.

FIG. 10 shows a specific example of the structure of variable frequency oscillator 50 according to this exemplary embodiment. Variable frequency oscillator 50 is a frequency synthesizer composed of a phase synchronous circuit that is ordinarily used for an RF circuit. Variable frequency oscillator 50 is composed of phase comparator 60, filter 61, voltage control oscillator 62, and frequency divider 63. The oscillation frequency can vary corresponding to the frequency division ratio of frequency divider 63. An input signal of variable frequency oscillator 50 is a crystal oscillation wave or the like from which a stable and high accurate signal is obtained. To obtain an LO signal having four phases that vary by 90 degrees each according to this exemplary embodiment, variable frequency oscillator 50 oscillates at a frequency four times higher than the LO frequency. Thus, with the numerical example of this exemplary embodiment, voltage control oscillator 62 oscillates at the maximum frequency of 4000 MHz (four phases×1000 MHz). To obtain an LO signal having a frequency of 40 MHz and 32 phases that vary by 11.25 degrees each, voltage control oscillator 62 oscillates at the minimum frequency of 1280 MHz (32 phases×40 MHz). When variable frequency oscillator 50 oscillates at a frequency four times higher than the LO frequency so as to obtain an LO signal having four phases, even if the duty ratio of the output signal of variable frequency oscillator 50 deviates from 50%, since counter 51 performs a counting operation only in synchronization with the timing that the output signal of variable frequency oscillator 50 goes high, as will be described later, as an advantage of this exemplary embodiment, an LO signal having four phases that vary by 90 degrees each can be obtained in high accuracy.

Counter 51 performs a counting operation that counts up only by one in synchronization with the timing that the output signal of variable frequency oscillator 50 goes high and counter 51 outputs the counted result to multiplying unit 52. If counter 51 overflows, it counts up from 0 again. The number of bits W of counter 51 depends on up to what order harmonics of the LO signal lie in the usable bandwidth of the receiver if the LO frequency is the lowest. With W bits, up to ($2^W$−3)-th order harmonics can be eliminated. In other words, W is selected such that if the LO frequency is the lowest, the ($2^W$−3)-th order harmonic lies out of the usable bandwidth. Normally, it is sufficient that W is 5 bits or 6 bits. With the numerical example of this exemplary embodiment, it is sufficient that W=5 bits. With W=5 bits, up to 29-th order harmonics can be eliminated. Counter 51 counts up repeatedly from 0 to 31 for every period of the output signal of variable frequency oscillator 50 (=$1/f_{Ref}$ where $f_{Ref}$ is the oscillation frequency of variable frequency oscillator 50).

Multiplying unit 52 multiplies the output of counter 51 by control word CW1 and outputs the multiplied result that is a phase value to LUT 53. Since signals are orthogonally demodulated, the number of bits of CW1 is represented as (W−2). In other words, even if the third-order harmonic of the LO signal lies out of the usable bandwidth, an LO signal having four phases that vary by 90 degrees each is required. In other words, the output of phase counter 55 needs to have at least four states. The foregoing N corresponds to ($2^{W-1}$/CW). Taking into account that N is selected such that it becomes a power of 2, CW1 becomes a power of 2 (1, 2, 4, 8, . . . ) that is smaller than $2^{W-1}$ and thereby the frequency of variable frequency oscillator 50 becomes a power of 2 of the LO frequency ($2^W$/CW). If CW1 is a power of 2, multiplying unit 52 can be implemented as a simple bit shift arithmetic unit. With the numerical example of this exemplary embodiment, CW1 is any value from among 1, 2, 4, and 8 that is a three-bit digital value. CW1 is selected such that the ($2^W$/CW1−1)-th order harmonic of the LO signal lies out of the usable bandwidth corresponding to the frequency of the desired signal. If the LO frequency is 400 MHz, it is sufficient that CW1=8. At this point, the output values of multiplying unit 52 become 0, 8, 16, 24, . . . , 248. Taking account of only low order five bits that are input to DAC 54, while counter 51 counts up from 0 to 31, output values of 0, 8, 16, and 24 are repeated eight times. In other words, LO frequency $f_{LO}$ and phase resolution $\Delta\phi$ become $f_{LO}=f_{Ref}\times 8/32=f_{Ref}/4$ and $\Delta\phi=360°\times 8/32=90$ degrees, respectively, where $f_{Ref}$ is the frequency of variable frequency oscillator 50. When the LO frequency is 200 MHz, it is sufficient that CW1=4. At this point, the output values of multiplying unit 52 become 0, 4, 8, 16, . . . , 124. Taking account of only the low order five bits, output values of 0, 4, 8, 12, . . . , 28 are repeated four times. In other words, the LO frequency $f_{LO}$ and the phase resolution $\Delta\phi$ become $f_{LO}=fRef/8$ and $\Delta\phi=45$ degrees, respectively. When the LO frequency is 120 MHz, with CW1=2, $f_{LO}=f_{Ref}/16$ and $\Delta\phi=22.5$ are obtained. When these results are generalized, frequency $f_{LO}$ of the LO signal and phase resolution $\Delta\phi$ can be given by the following formula (4).

$$f_{LO}=f_{Ref}\times CW1/2^w$$

$$\Delta\Phi=360°/(f_{Ref}/f_{LO})=360°\times CW1/2^w \quad \text{[Formula 4]}$$

In other words, when CW1 is doubled, the LO frequency is also doubled, but the phase resolution is halved thereby becomes coarse. The outputs of phase counter 46 corresponding to CW1=8, 4, 2, and 1 are shown in FIGS. 11(A), (B), (C), and (D), respectively.

According to this exemplary embodiment, the number of bits of counter 51 is fixed and phase counter 55 causes multiplying unit 52 to perform a bit shift operation corresponding to control word CW1. Even if phase counter 55 causes the number of bits of counter 51 to vary with CW1, the same effect can be obtained (in this case, multiplying unit 52 can be omitted). For example, when CW1=8, phase counter 55 operates as a two-bit counter; when CW1=4, phase counter 55 operates as a three-bit counter; when CW1=2, phase counter 55 operates as a four-bit counter; and when CW1=1, phase counter 55 operates as a five-bit counter.

Figure 12:
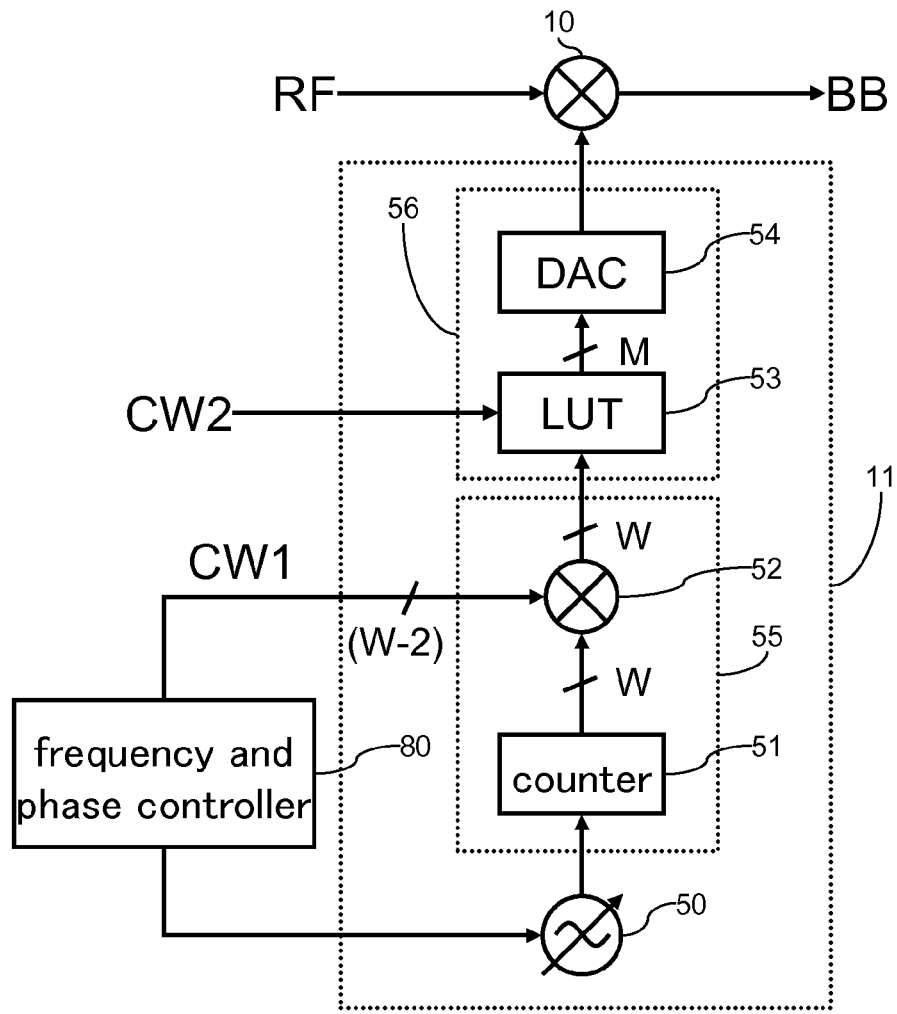
FIG. 12 is a schematic diagram exemplifying a specific structure of the frequency converter according to the first exemplary embodiment of the present invention.

As described above, the frequency of variable frequency oscillator 50 and the phase resolution of phase counter 55 are decided depending on the LO frequency. Thus, as shown in FIG. 12, the frequency converter according to this exemplary embodiment may have frequency and phase controller 80 that outputs control word CW1 to phase counter 55 and a frequency control signal to variable frequency oscillator 50.

LUT 53 stores amplitude values (digital values) for individual phase values (digital values). An amplitude value varies corresponding to control signal CW2 and is decided depending on the frequency and intensity of an interference signal.

LUT 53 converts the phase value that is output from phase counter 55 into an amplitude value corresponding to the phase value and then outputs the amplitude value to DAC 54. As with this exemplary embodiment, when an interference signal having a frequency of an odd order harmonic of the LO signal needs to be eliminated, LUT 53 converts a phase value that is output from phase counter 55 into a sine value or cosine value that corresponds to the phase value. Specifically, when W=5 bits and CW=$2^3$=8, phase counter 55 outputs phase values 0, 8, 16, and 24 that correspond to phases 0, 90, 180, and 270 degrees, respectively. Thus, LUT 53 outputs cosine values cos (0°)=1, cos (90°)=0, cos (180°)=−1, and cos (270°)=0 that are digital values. Of course, to obtain its orthogonal signal, LUT 53 outputs a sine value corresponding to the phase value. The number of bits M of LUT 53 depends on how many harmonics of the LO signal need to be suppressed. To suppress harmonics to 0.1% or less of the desired signal, the number of bits M needs to be 10 bits.

Figure 13:
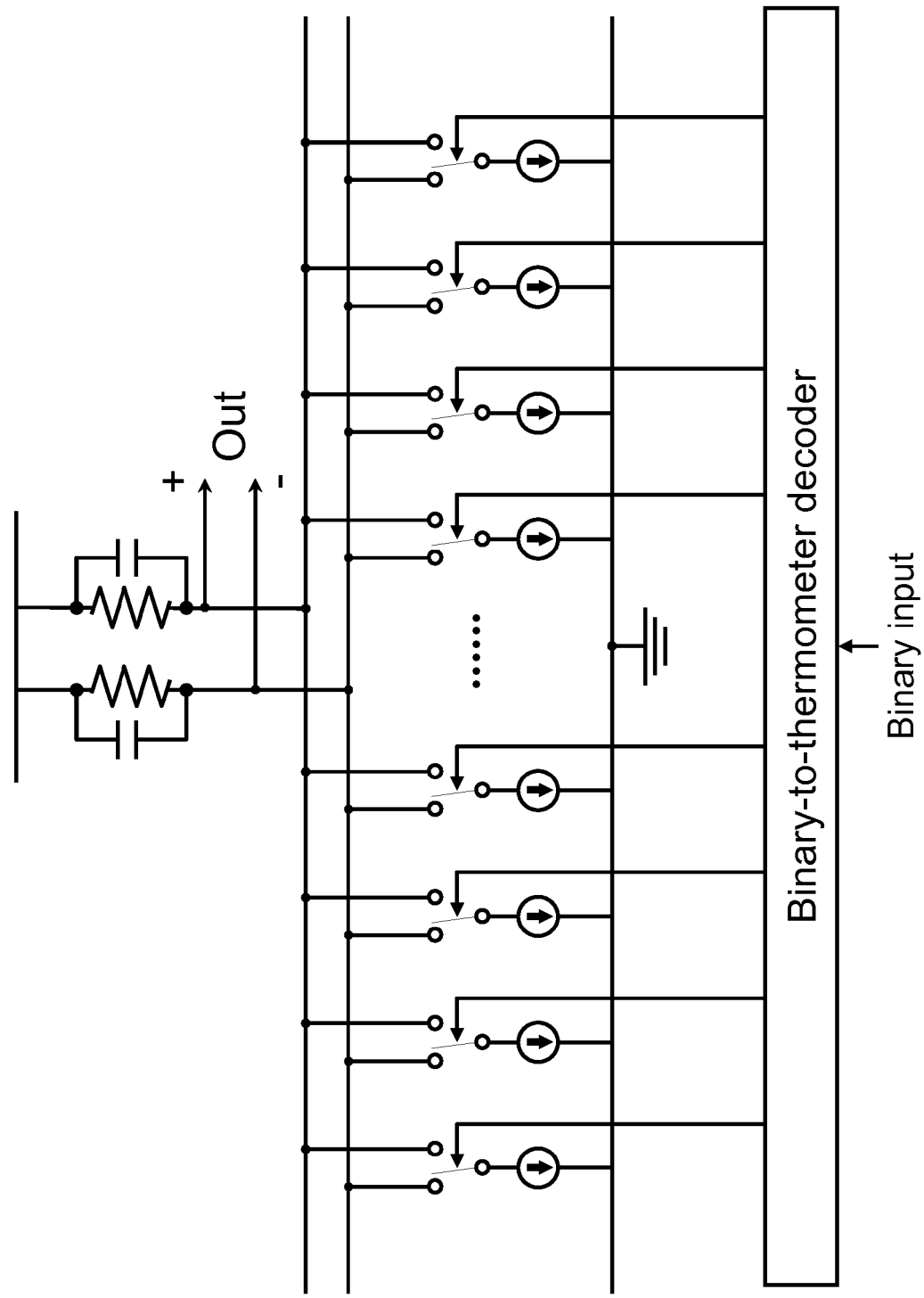
FIG. 13 is a schematic diagram exemplifying a specific structure of a circuit of a DAC according to the first exemplary embodiment of the present invention.

DAC 54 converts an amplitude value that is a digital value and that is output from LUT 53 into an analog value and then outputs the analog value to mixer 10. The signal that is output from DAC 54 is a step-shaped analog signal. FIG. 13 shows a specific example of a circuit of DAC 54. DAC 54 converts input binary code into thermometer code and connects current sources to a plus output terminal or a minus output terminal depending on the thermometer code. An output signal of DAC 54 is obtained in such a manner that a load resistor converts the current signal into a voltage. Capacitors connected in parallel with the load resistors eliminate unnecessary spurious components such as field-through digital signals. The number of bits of DAC 54 is the same as that of LUT 53. According to this exemplary embodiment, the LO signal is transferred as a binary square digital signal regardless of the LO frequency until DAC 54 coverts the LO signal into an analog signal. Such a digital signal can be transferred using a recent miniaturized CMOS structure that allows the size of circuit area and power consumption to be reduced. Alternatively, a DAC that uses current sources and resistors that are weighted with binary and a so-called R-2R ladder type DAC in which a resistor having resistance R and a resistor having resistance 2R are connected in a ladder shape could be applied as DAC 54 without deteriorating the effect of this exemplary embodiment.

As described above, the LO signal has a phase resolution decided depending on the LO frequency and a waveform that approximates to a sine wave or a cosine wave such that interference signals having frequencies of odd-order harmonics of the LO signal are eliminated.

Figure 14:
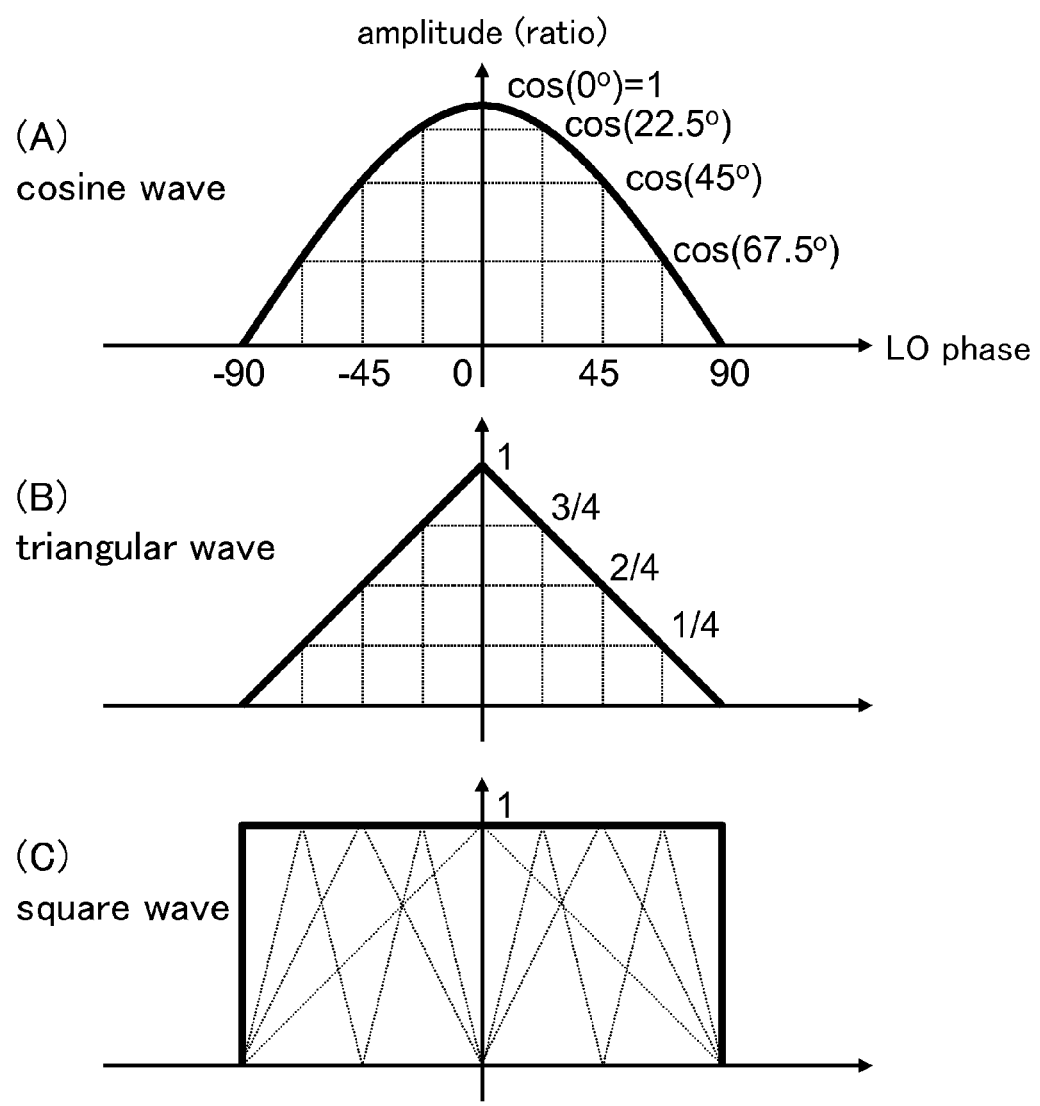
FIG. 14 is a schematic diagram showing the relationship between LO phases and tap coefficients of the frequency converter according to the first exemplary embodiment of the present invention.
Figure 16:
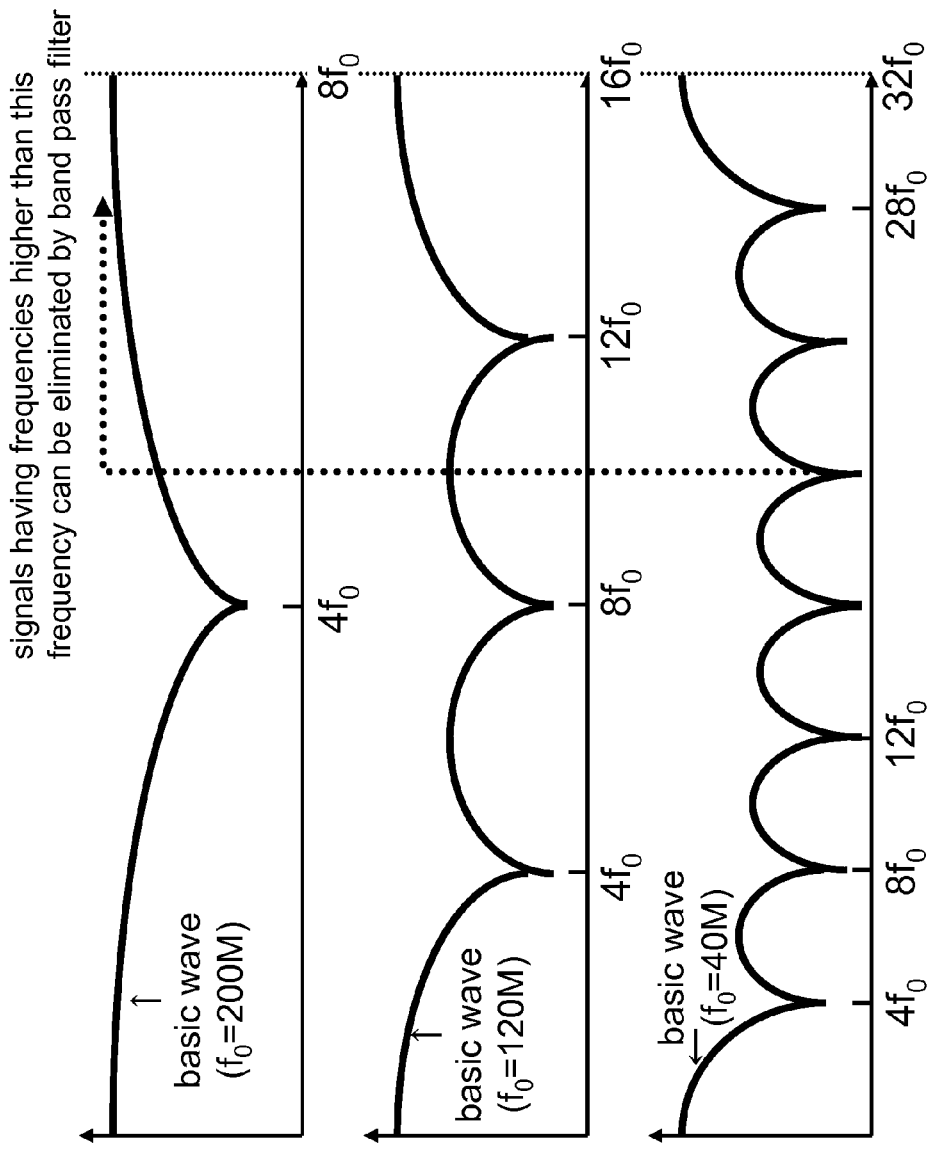
FIG. 16 is a schematic diagram further exemplifying a frequency characteristic of the frequency converter according to the first exemplary embodiment of the present invention.
Figure 18:
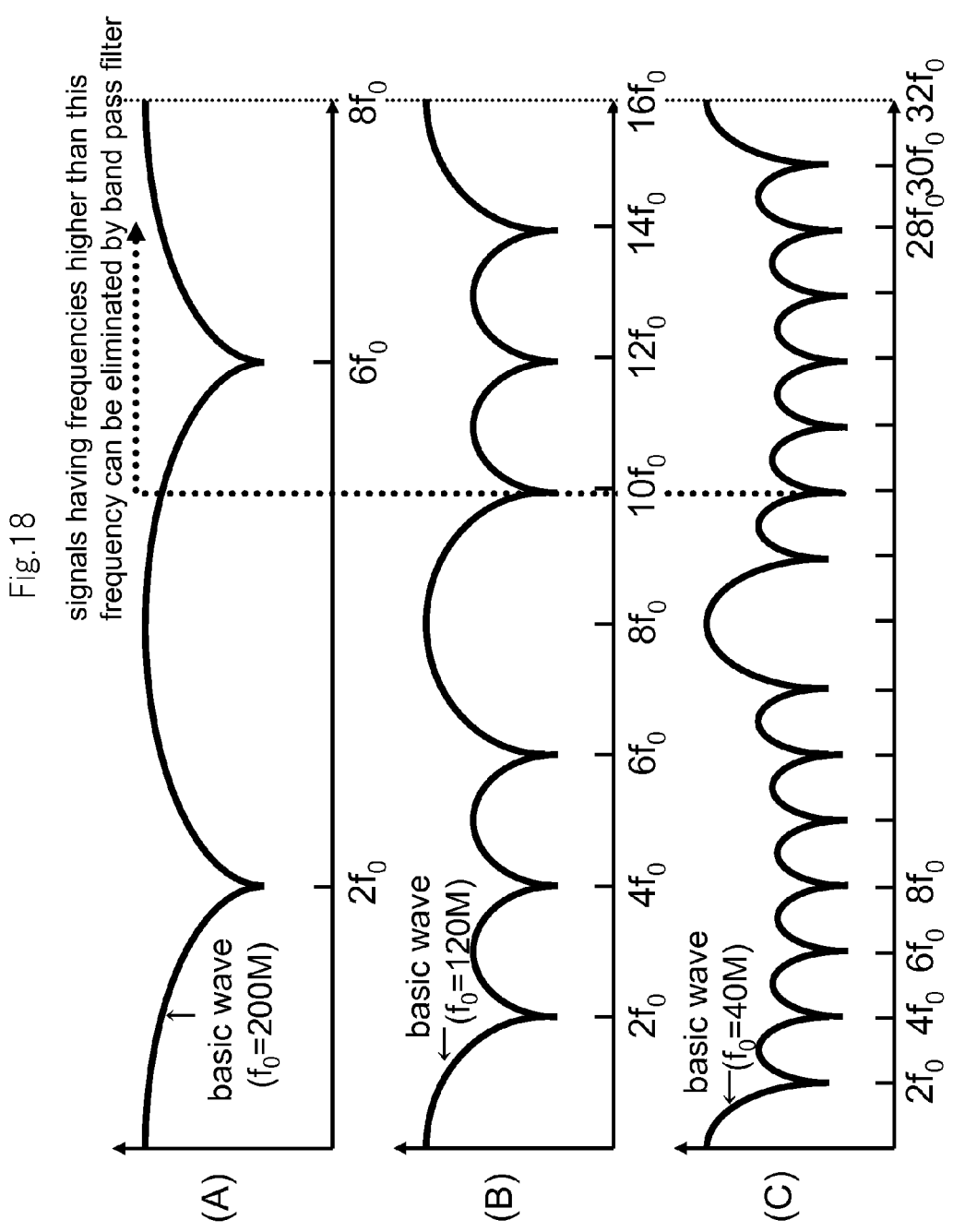
FIG. 18 is a schematic diagram further exemplifying a frequency characteristic of the frequency converter according to the first exemplary embodiment of the present invention.

Thus, the frequency converter according to this exemplary embodiment has a characteristic of an FIR filter in which zero points occur at odd-order harmonics of the LO signal. This denotes that tap coefficients of the FIR filter are selected such that phases of the LO signal are proportional to cosine values (or sine values) as shown in FIG. 14(A). However, if the tap coefficients of the FIR filter are changed, other characteristics of the FIR filter can be accomplished. As another simple example of an FIR filter, tap coefficients represented by a liner function of individual phase values may be selected as shown in FIG. 14(B). This denotes that an LO signal that approximates a triangular wave is used as shown in FIG. 15. At this point, the characteristic of the FIR filter denotes that as shown in FIG. 16, zero points occur at frequencies four times, eight times, 12 times, . . . higher than the LO frequency (the effect of the sinc filtering by integration of currents is not shown). The number of zero points shown in FIG. 16 is half the number of zero points shown in FIG. 7 because two zero points are combined as one in FIG. 16. Thus, in FIG. 16, the width and depth of each notch become wide and deep relative to those shown in FIG. 7. As a result, very large attenuations can be obtained. Thus, if it is known that there is a large interference signal having a frequency of a fourth-order harmonic of the LO signal, this characteristic of the FIR filter is very useful. The transfer functions in the case in which the number of taps is 3, 5, and 15 can be expressed by the following formulas (5), (6), and (7), respectively.

$$H_3(z^{-1})=1/2+z^{-1}+1/2z^2 \qquad \text{[Formula 5]}$$

$$H_7(z^{-1})=1/4+2/4z^{-1}+3/4z^{-2}+4/4z^{-3}+3/4z^{-4}+2/4z^{-5}+1/4z^{-6} \qquad \text{[Formula 6]}$$

$$H_{15}(z^{-1})=1/8+2/8z^{-1}+3/8z^{-2}+\ldots+2/8z^{-13}+1/8z^{-14} \qquad \text{[Formula 7]}$$

When tap coefficients vary such that zero points occur at frequencies other than four times, eight times, 12 times, . . . higher than the LO frequency, the FIR filter can have the characteristic of a wide bandwidth and large amount of attenuation.

As another simple example, as shown in FIG. 14(C), tap coefficients that are represented by a binary that comprises 0 and a positive value (or a binary that comprises 0 and a negative value) may be selected. This denotes that an LO signal having a square waveform as shown in FIG. 17 is used. At this point, the FIR filter has a characteristic in which zero points occur at even-order harmonics of the LO signal except for the half frequency of the sampling frequency (the effect of the sinc filtering by integration of currents is not shown). Thus, if the linearity of even-order harmonics of the LO signal in mixer 10 is large and if strong interference signals having frequencies of even order harmonics of the LO signal are known, this characteristic is very useful. The transfer functions in the case in which the number of taps is 3, 7, and 15 can be expressed by the following Formula (8), (9), or (10), respectively. In these formulas, since the coefficient of each odd-order coefficient of $z^{-1}$ is 0, these formulas substantially denote that moving averages of two points, four points, and eight points are obtained.

$$H_3(z^{-1})=1+z^{-2} \qquad \text{[Formula 8]}$$

$$H_7(z^{-1})=1+z^{-2}+z^{-4}+z^{-6} \qquad \text{[Formula 9]}$$

$$H_{15}(z^{-1})=1+z^{-2}+\ldots+z^{-12}+z^{-14} \qquad \text{[Formula 10]}$$

(2) Second Exemplary Embodiment

Figure 19:
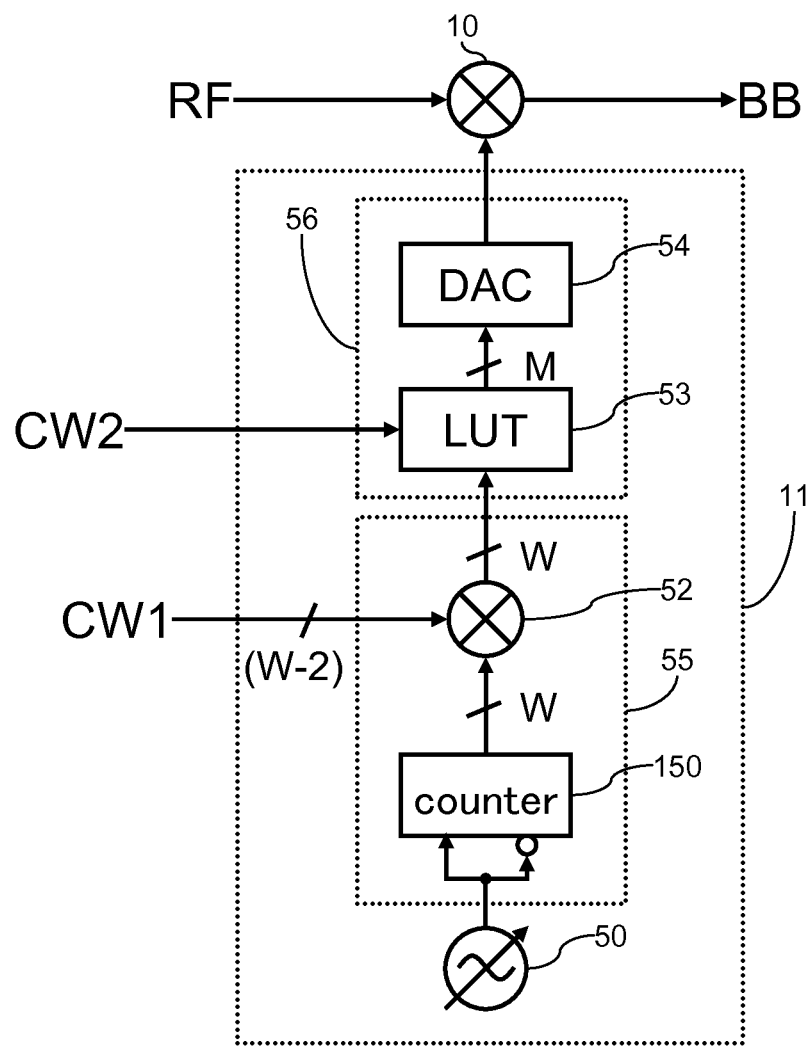
FIG. 19 is a schematic diagram showing the structure of a frequency converter according to a second exemplary embodiment of the present invention.

FIG. 19 shows the structure of a frequency converter according to a second exemplary embodiment of the present invention. The frequency converter according to this exemplary embodiment is different from the frequency converter according to the first exemplary embodiment in that phase counter 55 causes counter 150 to perform a counting operation in synchronization with both the timings that the output signal of variable frequency oscillator 50 goes high and low. Thus, since counter 150 operates at a frequency two times higher than the frequency of variable frequency oscillator 50, the frequency range of variable frequency oscillator 50 is half of the first exemplary embodiment. With the numerical example of the first exemplary embodiment, variable frequency oscillator 50 has a frequency range from 640 MHz to 2000 MHz. As a result, the current consumption of variable frequency oscillator 50 and the drive circuit of counter 150 can be suppressed.

Figure 20:
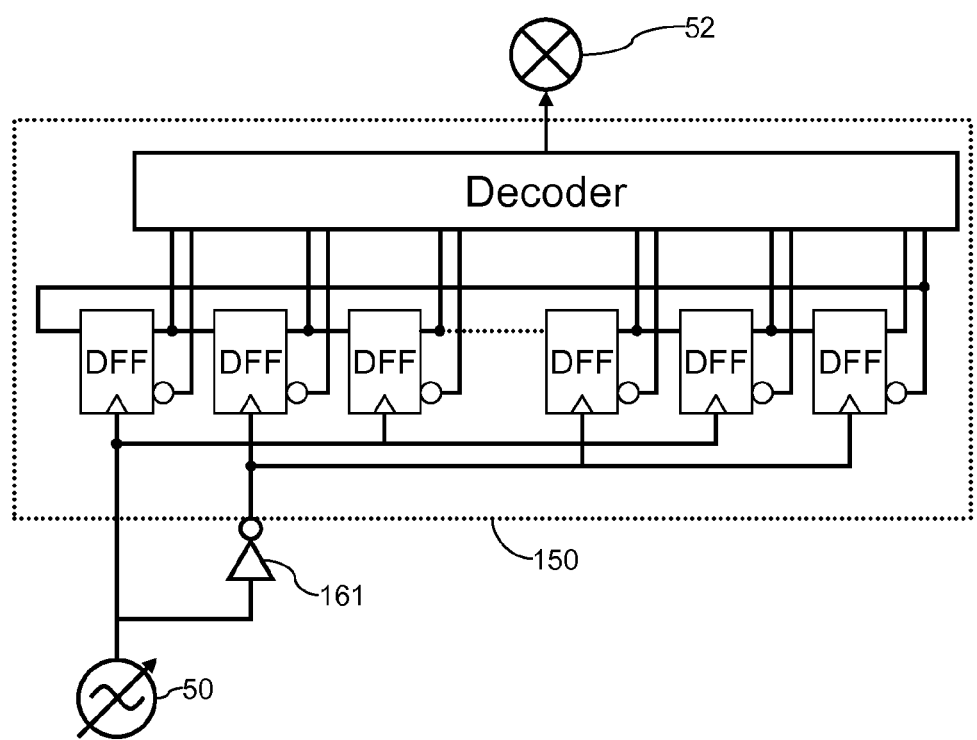
FIG. 20 is a schematic diagram exemplifying the structure of a circuit of a counter according to the second exemplary embodiment of the present invention.

FIG. 20 shows a specific example of a circuit of counter 150 according to this exemplary embodiment. Counter 150 has a shift counter composed of delay type flip-flops (DFFs) that are connected in tandem; and a decoder that converts an output signal of the shift counter into a binary digital signal. Since clock signals having phases of 0 degree and 180 degrees are alternately input to clock input terminals of the DFFs that are connected in tandem, counter 150 effectively operates at a frequency twice higher than the frequency of the input clock signals. This shift counter outputs multi-phase clock signals having a duty ratio of 50% in which they delay by half period relative to the input clock signals. The decoder converts these multi-phase clock signals into binary digital signals corresponding to phase states of the multi-phase clock signals. For example, if 16 DFFs are connected in tandem, a clock signal having 32 phases can be obtained. When the clock signal is decoded, a five-bit binary signal can be obtained. Although inverter 161 is shown in the drawing, if variable frequency oscillator 50 outputs differential signals, inverter 161 can be omitted.

(3) Third Exemplary Embodiment

Figure 21:
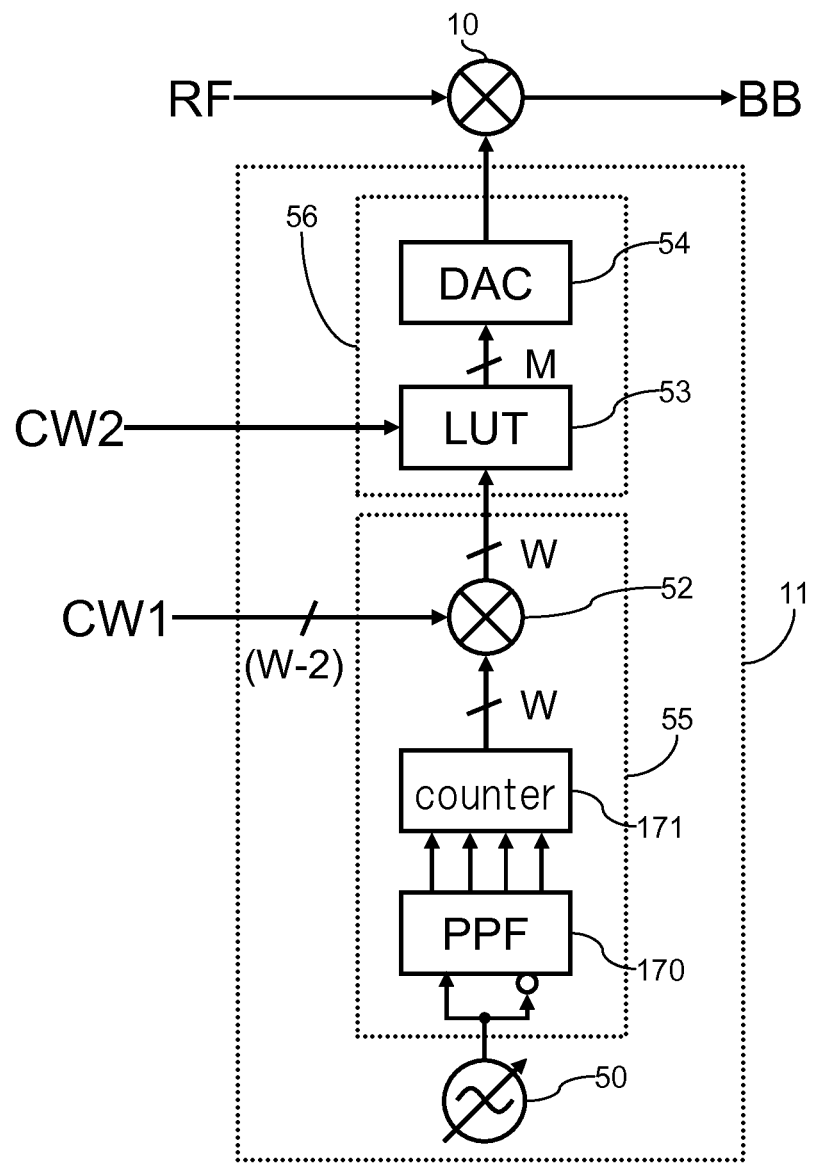
FIG. 21 is a schematic diagram showing the structure of a frequency converter according to a third exemplary embodiment of the present invention.

FIG. 21 shows the structure of a frequency converter according to a third exemplary embodiment of the present invention. The frequency converter according to this exemplary embodiment is different from the frequency converters according to the first and second exemplary embodiments in that phase counter 55 causes poly-phase filter (PPF) 170 to convert an output signal of variable frequency oscillator 50 into a signal having four phases that vary by 90 degrees each and drives counter 171 with the four-phase signal. Since counter 1711 operates at a frequency four times higher than the frequency of variable frequency oscillator 50, the frequency range of variable frequency oscillator 50 becomes half that of the second exemplary embodiment. Thus, with the numerical example of the first exemplary embodiment, variable frequency oscillator 50 has a frequency range from 320 MHz to 1000 GHz. As a result, the current consumption of variable frequency oscillator 50 and the drive circuit of counter 171 can be suppressed. However, to cause PPF 170 to output a clock signal having a total of four phases that vary accurately by 90 degrees each, it is necessary to vary the time constant of PPF 170 corresponding to the LO frequency.

Figure 22:
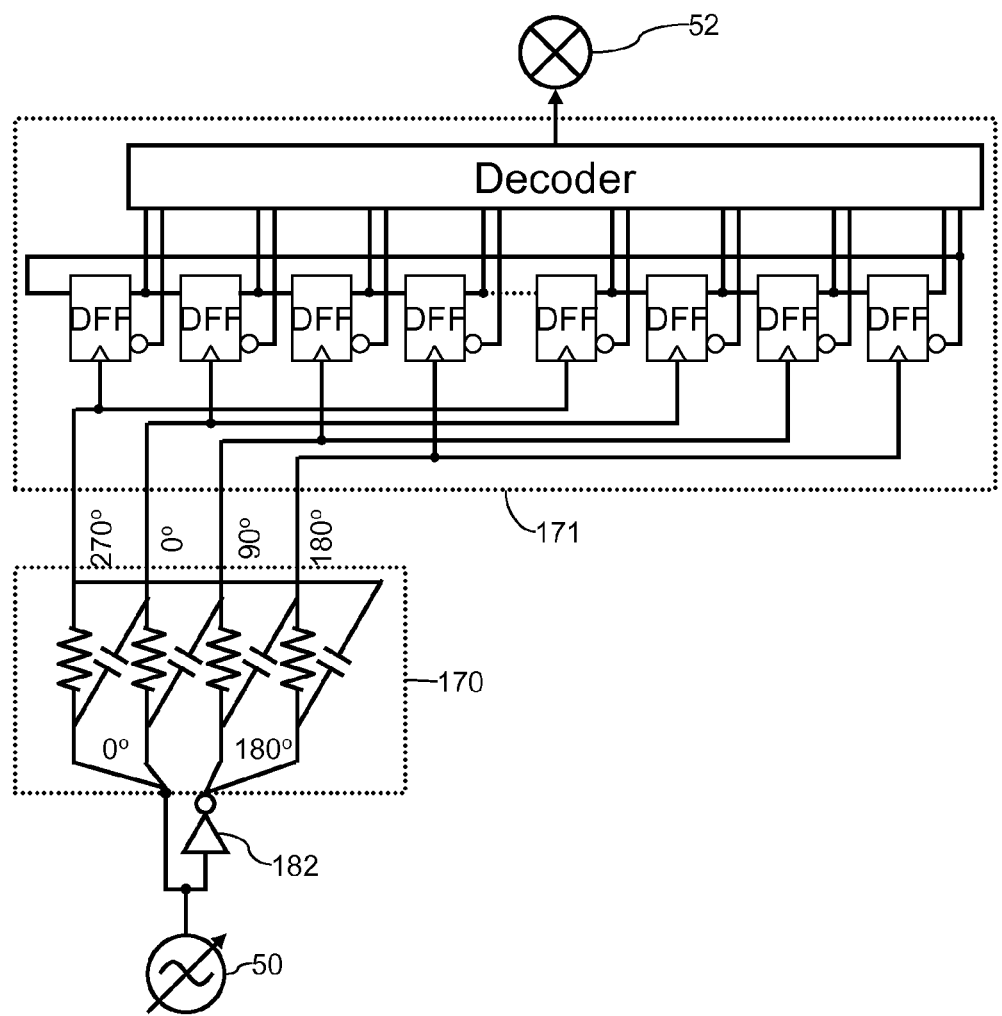
FIG. 22 is a schematic diagram exemplifying the structure of a circuit of a PPF and a counter according to the third exemplary embodiment of the present invention.

FIG. 22 shows a specific example of circuits of PPF 170 and counter 171 according to this exemplary embodiment. Counter 171 is composed of a shift counter composed of DFFs that are connected in tandem; and a decoder that converts an output signal of the shift counter to a binary digital signal. PPF 170 shifts phases of a signal having two phases using resistors and capacitors and outputs a signal having four phases that vary by 90 degrees each. This shift counter is different from the shift counter shown in FIG. 20 in that PPF 170 cyclically inputs clock signals having phases of 0, 90, 180, and 270 degrees to clock signal input terminals of the individual DFFs that are connected in tandem, and thereby in that the shift counter shown in FIG. 22 operates at a frequency four times higher than the frequency of the input clock signals. This shift counter outputs a multi-phase clock signal that is shifted by a 1/4 period of the input clock signal and that has a duty ratio of 50%. The decoder converts the multi-phase clock signals into binary digital signals corresponding to the phases of the multi-phase clock signal. The number of DFFs required for counter 171 according to this exemplary embodiment is the same as that of the second exemplary embodiment. Although inverter 182 is shown in the drawing, if variable frequency oscillator 50 outputs differential signals, inverter 182 can be omitted.

(4) Fourth Exemplary Embodiment

Figure 23:
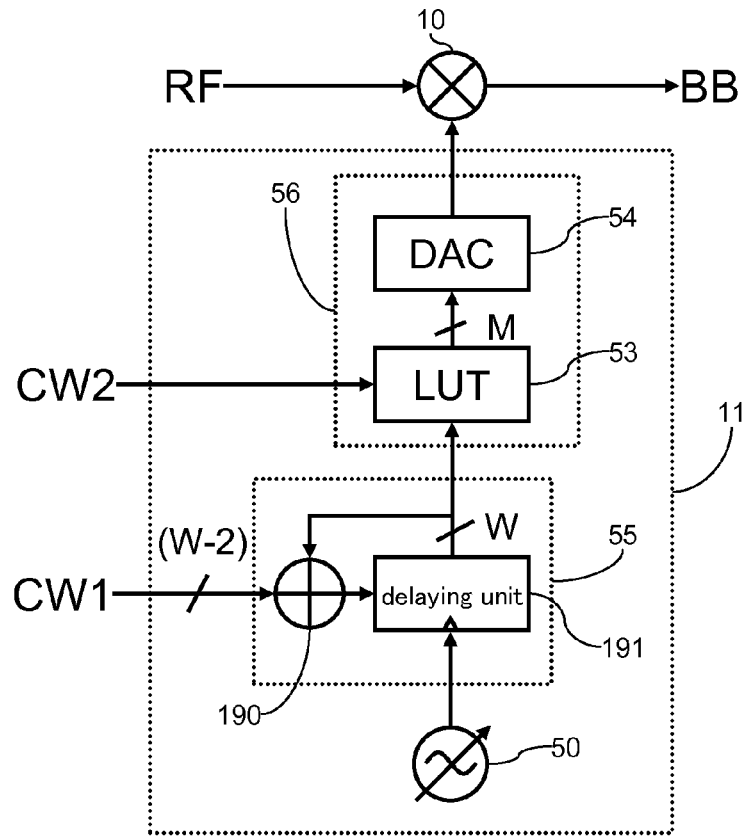
FIG. 23 is a schematic diagram showing the structure of a frequency converter according to a fourth exemplary embodiment of the present invention.

FIG. 23 shows the structure of a frequency converter according to a fourth exemplary embodiment of the present invention. The frequency converter according to this exemplary embodiment is different from the frequency converters according to the first to third exemplary embodiments in that instead of a counter and a multiplying unit, phase counter 55 has adding unit 190 that adds an amplitude value that is output from phase counter 55 and control word CW1; and delaying unit 191 that delays the added result that is output from adding unit 190 by a period of an output signal of variable frequency oscillator 50 and then outputs the resultant signal that is a phase value to LUT 53. LO signal generator 11 according to this exemplary embodiment has a structure of a direct digital synthesizer (DDS) that is ordinarily used. The number of bits W of each of adding unit 190 and delaying unit 191 is the same as the number of bits of each of the counters according to the first to third exemplary embodiments. It is sufficient that the number of bits W of each of adding unit 190 and delaying unit 191 is 5 bits or 6 bits unlike with an ordinary DDS that uses a phase counter having 28 bits or 32 bits that results in large power consumption. In the structure using an adding unit and a delaying unit according to this exemplary embodiment, when delaying unit 191 is driven with differential signals or four phases in the same manner as the second or third exemplary embodiment, the frequency of variable frequency oscillator 50 could be halved or quartered compared with that of the first exemplary embodiment.

(5) Fifth Exemplary Embodiment

Figure 24:
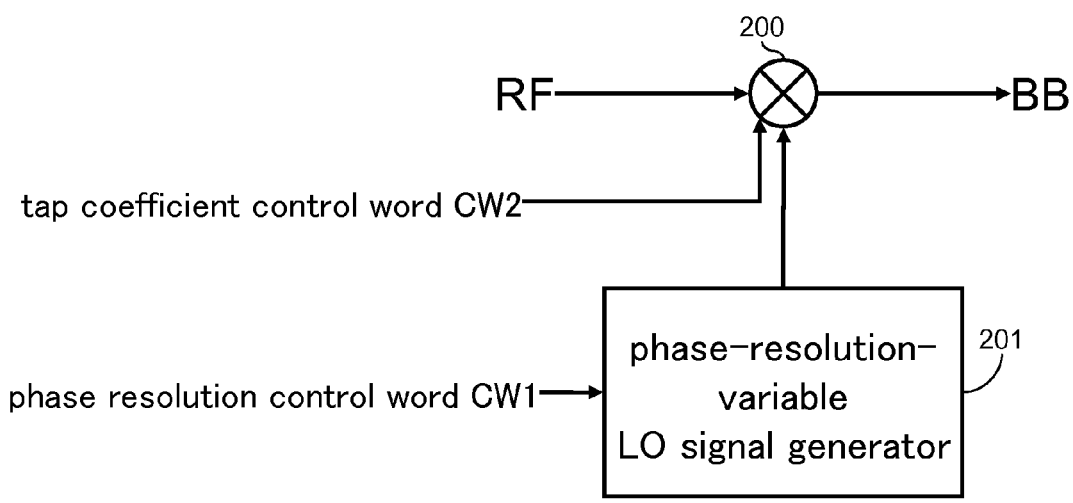
FIG. 24 is a schematic diagram showing the structure of a frequency converter according to a fifth exemplary embodiment of the present invention.

FIG. 24 shows the structure of a frequency converter according to a fifth exemplary embodiment of the present invention. The frequency converter according to this exemplary embodiment has mixer 200; and phase-resolution-variable LO signal generator 201 (hereinafter simply referred to as "LO signal generator" 201) that generates an LO signal having a variable phase resolution. The frequency converter according to this exemplary embodiment is different from the frequency converters according to the first to fourth exemplary embodiments in that instead of LO signal generator 201, mixer 200 controls a signal gain of the LO signal for each phase value thereof. Thus, control word CW2 is input to mixer 200.

Figure 25:
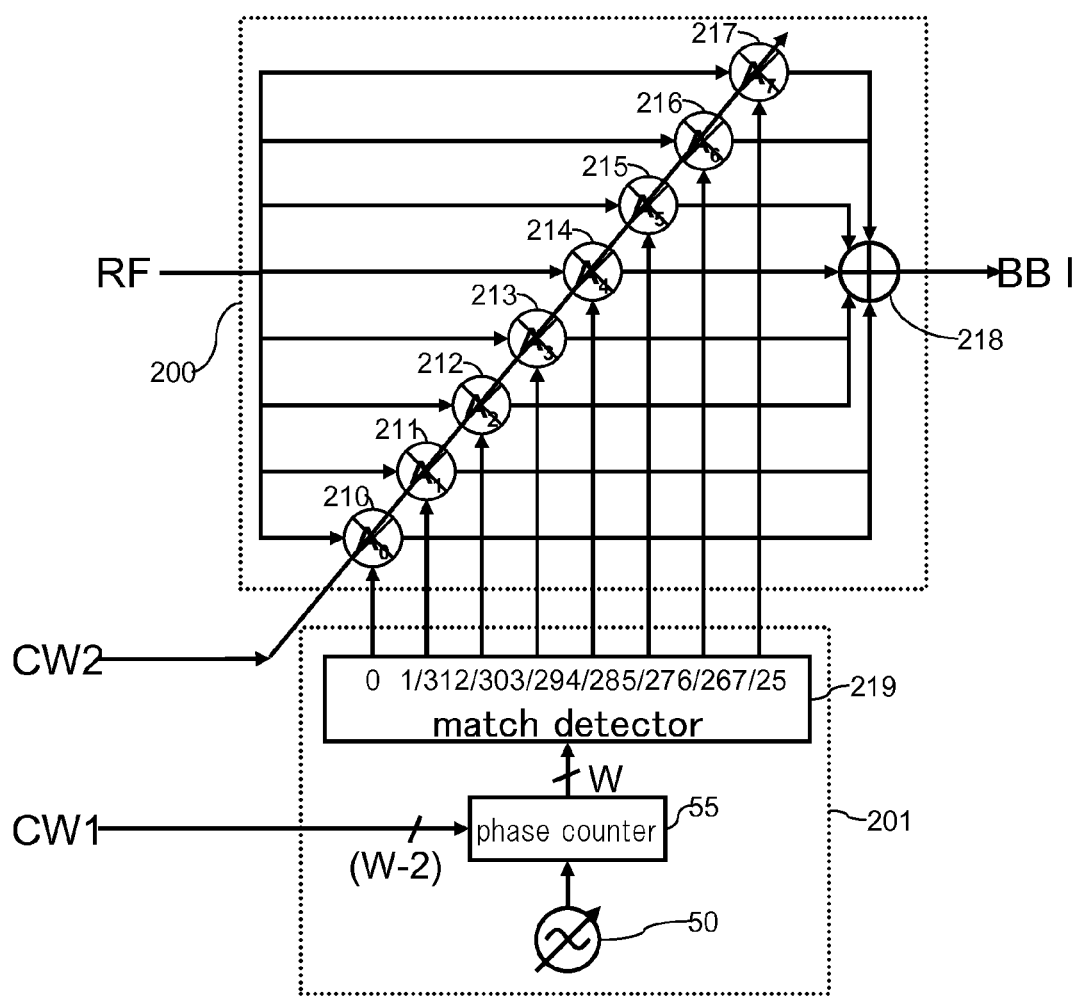
FIG. 25 is a schematic diagram exemplifying a specific structure of the frequency converter according to the fifth exemplary embodiment of the present invention.

FIG. 25 shows a specific example of the structure of the frequency converter according to this exemplary embodiment.

LO signal generator 201 is composed of variable frequency oscillator 50, phase counter 55, and match detector 219.

Match detector 219 is composed of a plurality of discrete match detectors (not shown). The discrete match detectors each detect whether or not a phase value that is output from phase counter 55 matches a phase value that has been designated. If so, they output a binary discrete LO signal to mixer 200. These discrete match detectors could be composed of a simple digital circuit.

Mixer 200 is composed of a plurality of discrete mixers 210~217; and an adding unit 218.

Discrete mixers 210~217 are located corresponding to a plurality of discrete match detectors and have signal gains corresponding to phases of discrete LO signals that are input from corresponding discrete match detectors. The signal gains can vary corresponding to control signal CW2. The signal gains are decided depending on frequencies and intensities of interference signals.

Discrete mixers 210~217 each multiply discrete LO signals that are input from corresponding discrete match detectors by the received RF signal and weight the multiplied results with signal gains corresponding to the phases of the discrete LO signals.

Adding unit 218 adds the weighted multiplied results that are output from discrete mixers 210~217 and outputs the added result.

Since the LO signals have a square waveform with sufficient amplitude, discrete mixers 210~217 can be switching mixers that have excellent linearity, can easily obtain signal gains, and can accomplish low noise index. In addition, since the frequency converter according to this exemplary embodiment has an additional route that transfers LO signals that are binary square waves compared to the first to fourth exemplary embodiments that use the DAC, the frequency converter according to this exemplary embodiment has advantages in which size of circuit area and power consumption are more reduced than in the first to fourth exemplary embodiments.

Next, the operation of the frequency converter according to this exemplary embodiment will be described with the numerical example of the first exemplary embodiment. In other words, it is assumed that the usable bandwidth of the receiver ranges from 40 MHz to 1000 MHz, W is 5 bits, and CW1 is a 3-bit digital value. In addition, it is assumed that interference signals to be eliminated have frequencies of odd-order harmonics of the LO signal.

Discrete mixers 210~217 need to have eight types of signal gains proportional to $A_0$=cos(0°), $A_1$=cos (11.25°), $A_2$=cos (22.5°), $A_3$=cos (33.75°), $A_4$=cos (45°), $A_5$=cos (56.25°), $A_6$=cos (67.5°), and $A_7$=cos (78.75°), respectively. Generally, the frequency converter according to this exemplary embodiment needs $2^{W-2}$ discrete mixers. The signal gains of these discrete mixers can be generally represented by $A_k$=cos (360°×k/$2^{W-2}$) where k is an integer ranging from 0 to ($2^{W-2}$−1). The number of discrete mixers used in the frequency converter according to this exemplary embodiment, ($2^{w-2}$−1) is around half of the number of mixers used in the receiver disclosed in Patent Literature 1, ($2^{W-1}$−1). This denotes that since the discrete LO signals do not simultaneously become the high level, discrete mixers having equal signal gains can be shared. Thus, the size of circuit area and current consumption of the discrete mixers can be reduced. In addition, although the discrete converters need to have equal signal gains, their deviations that occur during the manufacturing process can be alleviated.

Match detector 219 supplies a binary square wave that is a discrete LO signal to discrete mixer 210 such that only when the output of phase counter 55 is 0 (corresponding to phase 0°), the square wave becomes the high level and otherwise it becomes the low level. Likewise, match detector 219 supplies the square wave to discrete mixer 211 such that only when the output of phase counter 55 is 1 or 31 (corresponding to phase ±11.25°), the square wave becomes the high level. Match detector 219 supplies the square wave to discrete mixer 212 such that only when the output of phase counter 55 is 2 or 30 (corresponding to phase ±11.25°), the square wave becomes the high level. Match detector 219 supplies the square wave to discrete mixer 213 such that only when the output of phase counter 55 is 3 or 29 (corresponding to phase ±11.25°), the square wave becomes the high level. Match detector 219 supplies the square wave to discrete mixer 214 such that only when the output of phase counter 55 is 4 or 28 (corresponding to phase ±11.25°), the square wave becomes the high level. Match detector 219 supplies the square wave to discrete mixer 215 such that only when the output of phase counter 55 is 5 or 27 (corresponding to phase ±11.25°), the square wave becomes the high level. Match detector 219 supplies the square wave to discrete mixer 216 such that only when the output of phase counter 55 is 6 or 26 (corresponding to phase ±11.25°), the square wave becomes the high level. Match detector 219 supplies the square wave to discrete mixer 217 such that only when the output of phase counter 55 is 7 or 25 (corresponding to phase ±11.25°), the square wave becomes the high level. Since adding unit 218 adds outputs of discrete mixers 210~217 having signal gains corresponding to tap coefficients of the FIR filter, although square discrete LO signals are used, the frequency conversion for an LO signal that is a pseudo-cosine wave can be accomplished. In other words, interference signals having frequencies that lie in the usable bandwidth of the receiver and that are odd-order harmonics of the LO signal can be eliminated. In this case, the frequency converter operates so as to obtain base band I signal. If the phase of the LO signal is varied by 90 degrees, the frequency converter operates so as to obtain base band Q signal. If the phase of the LO signal is varied by 180 degrees, the frequency converter operates so as to obtain an inverted signal of base band I signal. If the phase of the LO single is varied by 270 degrees, the frequency converter operates so as to obtain an inverted signal of base band Q single.

Next, the operation of the frequency converter according to this exemplary embodiment will be described with desired signals having various frequencies.

First, it is assumed that the desired signal has a frequency of 400 MHz. In this case, an interference signal having a frequency that is three times higher than the frequency of the desired signal is eliminated by an upstream band pass filter. At this point, since CW1=8 and phase counter 55 outputs 0, 8, 16, and 24, only discrete mixer 210 operates. When phase counter 55 outputs 16, since an inverted signal of base band I signal is obtained, the waveform of the LO signal pseudo-represented by the operation of the frequency converter according to this exemplary embodiment matches the waveform shown in FIG. 6(A).

Next, it is assumed that the frequency of the desired signal is 200 MHz. In this case, interference signals having frequencies that are up to five times higher than the frequency of the desired signal are input to mixer 200. At this point, since CW1=4 and phase counter 55 outputs 0, 4, 8, . . . , 28, discrete mixers 210 and 214 operate. When the phase of the LO signal is shifted by 180 degrees, since an inverted signal of base band I signal is obtained, the waveform of the LO signal pseudo-represented matches the waveform shown in FIG. 6(B).

Likewise, when the frequency of the desired signal is 120 MHz, since CW1=2 and discrete mixers 210, 212, 214 and 216 operate, the waveform of the LO signal pseudo-represented matches the waveform shown in FIG. 6(C). When the frequency of the desired signal is 400 MHz, since CW1=1 and all discrete mixers 210~217 operate, the waveform of the LO signal pseudo-represented matches the waveform shown in FIG. 6(D).

Figure 26A:
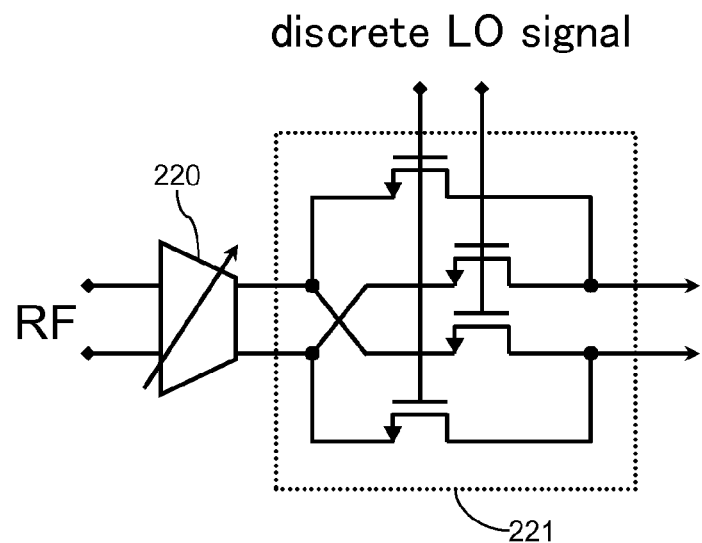
FIG. 26A is a schematic diagram exemplifying a specific structure of a circuit of discrete mixers according to the fifth exemplary embodiment of the present invention.
Figure 26B:
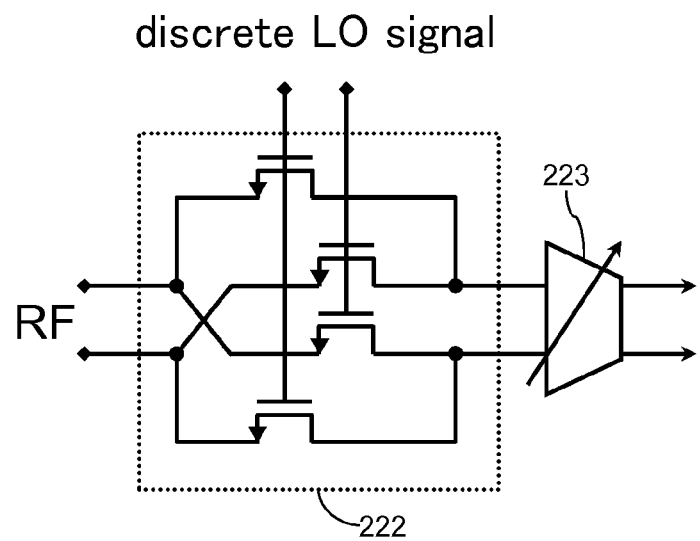
FIG. 26B is a schematic diagram further exemplifying a specific structure of a circuit of discrete mixers according to the fifth exemplary embodiment of the present invention.

FIG. 26A and FIG. 26B show specific examples of circuits of discrete mixers 210~217 according to this exemplary embodiment. FIG. 26A shows an example of a discrete mixer composed of voltage-to-current converter 220 and switching pair 221. In this example, voltage-to-current converter 220 converts an RF received signal (RF voltage signal) into a current signal, whereas switching pair 221 converts an RF current signal into a base band signal (current signal) and outputs the converted signal. The frequency conversion gain can vary corresponding to the voltage-to-current conversion gain of voltage-to-current converter 220. FIG. 26B shows an example of a discrete mixer composed of switching pair 222 and voltage-to-current converter 223. In this example, switching pair 222 converts an RF received signal (RF voltage signal) into a base band signal (voltage signal), whereas voltage-to-current converter 223 converts a base band signal (voltage signal) into a current signal. The frequency conversion gain can vary corresponding to the voltage-to-current conversion gain of voltage-to-current converter 223. In other words, FIG. 26A shows a discrete mixer that converts an RF signal (current signal) into a voltage signal, whereas FIG. 26B shows a discrete mixer that converts a base band signal (voltage signal) into a current signal.

Figure 27:
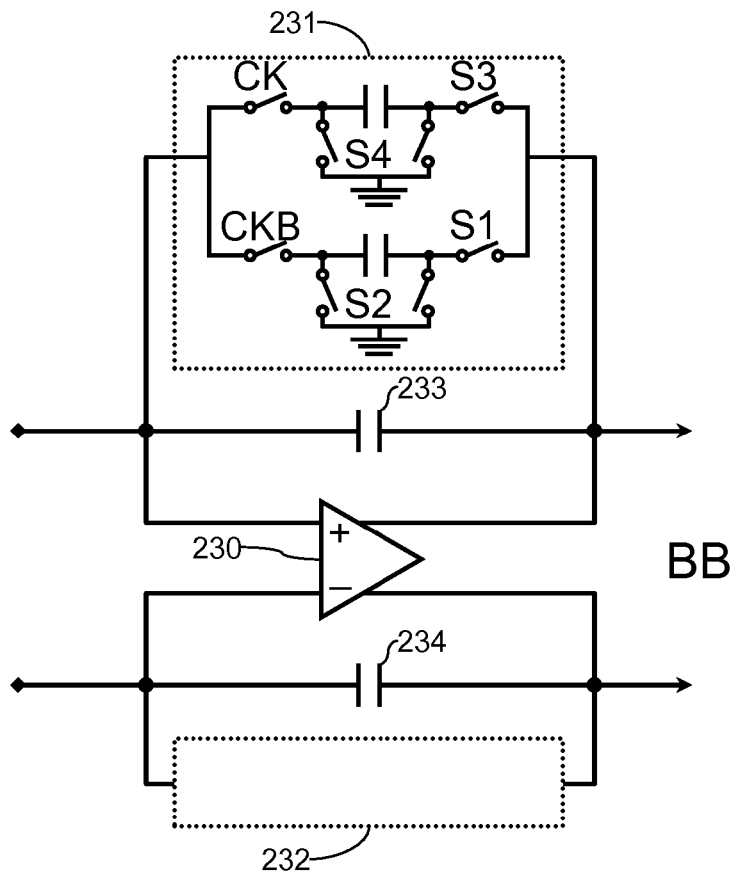
FIG. 27 is a schematic diagram exemplifying a specific structure of a circuit of an adding unit according to the fifth exemplary embodiment of the present invention.

FIG. 27 shows a specific example of a circuit of adding unit 218 according to this exemplary embodiment. Adding unit 108 is a transimpedance amplifier composed of operational amplifier 230, switched capacitor sections 231 and 232, and capacitors 233 and 234. Current flows from discrete mixers 210~217 to a plus input terminal of operational amplifier 230. The current flows to switched capacitor section 231. As a result, the upper output terminal of operational amplifier 230 outputs a voltage proportional to the current that flows to switched capacitor section 231. In contrast, reverse current flows to a minus input terminal of operational amplifier 230. As a result, a lower output terminal of operational amplifier 230 outputs a reverse voltage. Capacitor elements 233 and 234 are used to eliminate unnecessary interference signals. The operations of switched capacitor sections 231 and 232 are the same as those of switched capacitor sections 41 and 42 shown in FIG. 8A. In addition, the waveform of a clock that drives switched capacitor sections 231 and 232 is the same as the waveform shown in FIG. 8B.

Figure 28A:
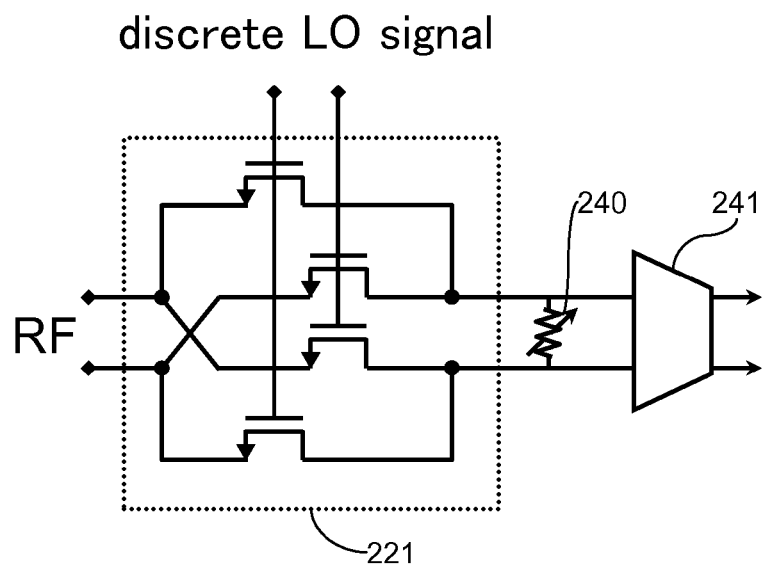
FIG. 28A is a schematic diagram further exemplifying a specific structure of a circuit of discrete mixers according to the fifth exemplary embodiment of the present invention.
Figure 28B:
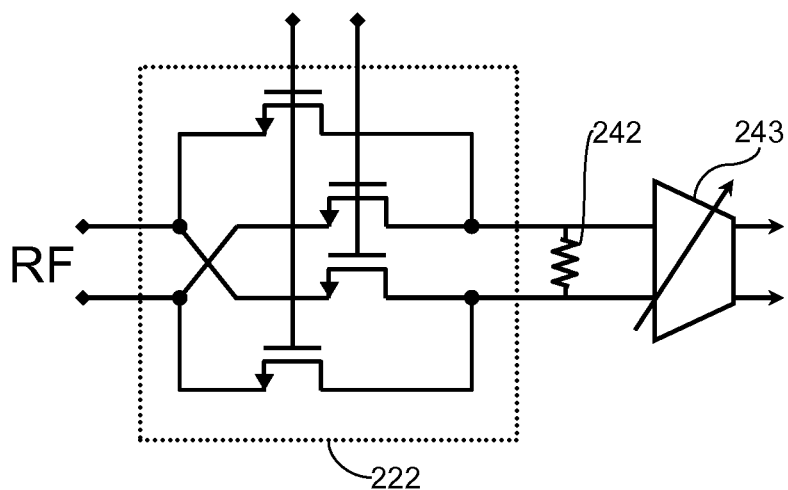
FIG. 28B is a schematic diagram further exemplifying a specific structure of a circuit of discrete mixers according to the fifth exemplary embodiment of the present invention.

If the received RF signal that is input to the frequency converter according to this exemplary embodiment is an RF current signal, discrete mixers 210~217 may be structured as shown in FIG. 28A or FIG. 28B. In this case, each of discrete mixers 210~217 is composed of switching pair 221 or 222; discrete load resistor 240 or 242 that converts a current signal into a voltage signal; and discrete voltage-to-current converter 241 or 243 that converts a voltage signal into a current signal again. In FIG. 28A, the signal gain varying function of discrete mixers 210~217 is accomplished by causing discrete load resistor 240 to be variable; in FIG. 28B, the signal gain varying function of discrete mixers 210~217 is accomplished by causing discrete voltage-to-current conversion gain of discrete voltage-to-current converter 243 to be variable. Adding unit 218 (see FIG. 25) that adds the outputs of discrete mixers 210~217 can be composed of a transimpedance amplifier that uses switched capacitor sections 41 and 42 shown in FIG. 8A and operational amplifier 230 shown in FIG. 27.

(6) Sixth Exemplary Embodiment

Figure 29:
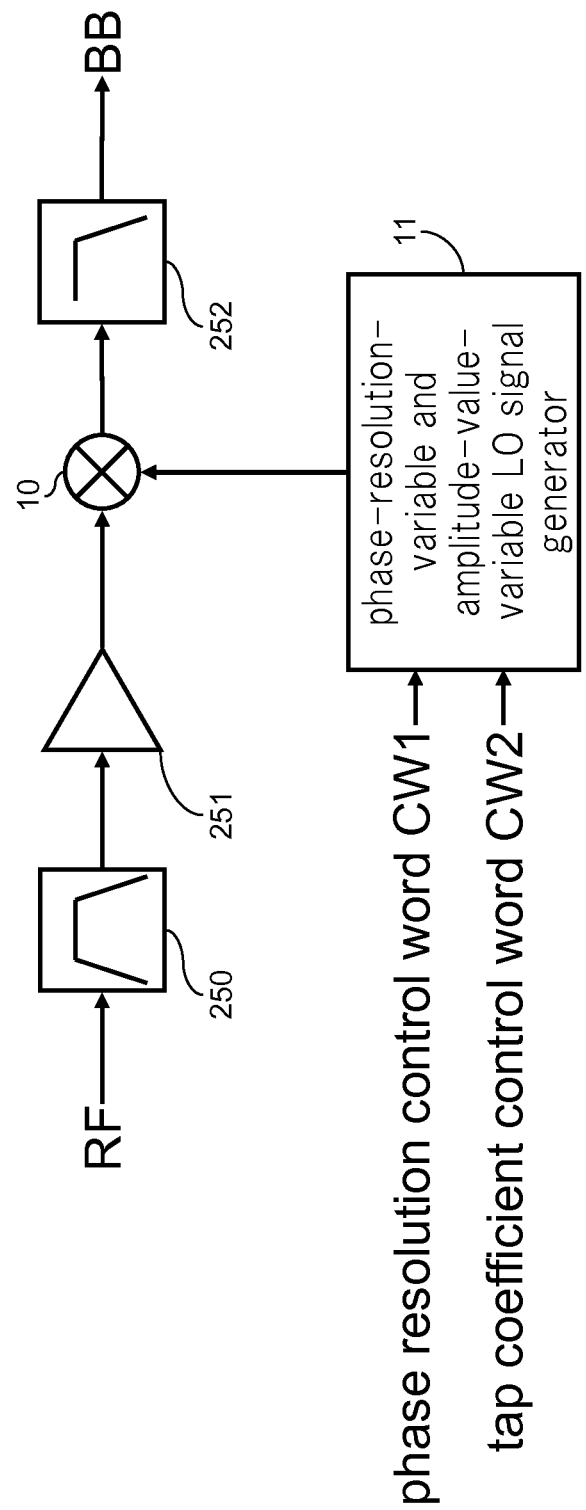
FIG. 29 is a schematic diagram showing the structure of a receiver according to a sixth exemplary embodiment of the present invention.

FIG. 29 shows the structure of a receiver according to a sixth exemplary embodiment of the present invention. The receiver according to this exemplary embodiment is composed of mixer 10; LO signal generator 11; band pass filter 250 that limits the bandwidth of the received RF signal in the usable bandwidth of the receiver; LNA 251; and channel pass filter 252 that eliminates interference signals having frequencies that are close to the frequency of a desired signal from the output signal of mixer 10. Mixer 10 and LO signal generator 11 are those according to any one of the first to fifth exemplary embodiments.

The receiver according to this exemplary embodiment can eliminate interference signals having various frequencies including odd-order harmonics of the LO signal using only one band selection filter 250 without it being necessary to use an RF tracking filter. Depending on the signal-to-noise ratio necessary for the communication, the receiver according to this exemplary embodiment might omit LNA 251. According to this exemplary embodiment, an analog-to-digital converter may be located downstream of mixer 10 so as to accomplish the function of channel pass filter 252 with a digital circuit.

Likewise, a receiver using the frequency converter according to the fifth exemplary embodiment could be accomplished.

(7) Seventh Exemplary Embodiment

Figure 30:
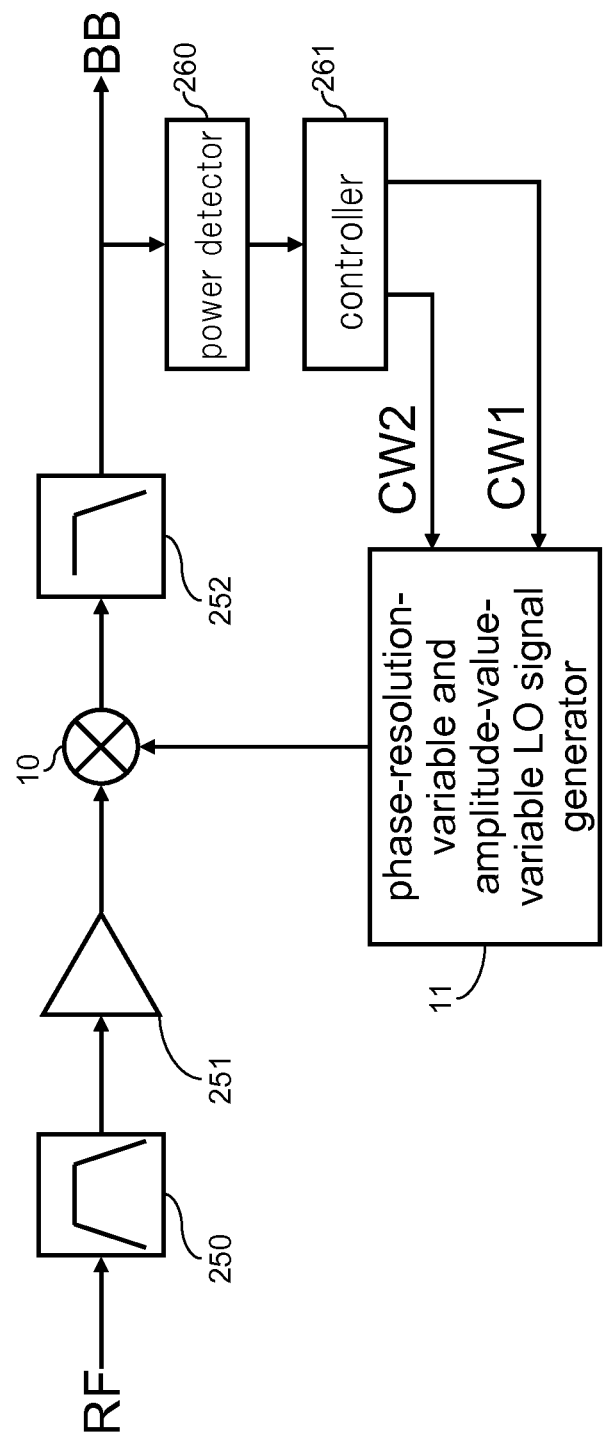
FIG. 30 is a schematic diagram showing the structure of a receiver according to a seventh exemplary embodiment of the present invention.

FIG. 30 shows the structure of a receiver according to a seventh exemplary embodiment of the present invention. The receiver according to this exemplary embodiment is different from the receiver according to the sixth exemplary embodiment in that power detector 260 that detects the power of an output signal of channel pass filter 252; and controller 261 that controls control words CW1 and CW2 that are input to LO signal generator 11 are also provided. Controller 261 sweeps LO frequencies in the usable bandwidth (pass bandwidth of band pass filter 250) of the receiver before starting communication so as to detect the radio field intensity distribution that represents the power of the output signal of channel pass filter 252 for each LO frequency and that controls the phase resolution of LO signal generator 11 and the amplitude value of the LO signal for each phase value based on the detected radio field intensity distribution. Thus, controller 261 also serves as the function of frequency and phase controller 80 shown in FIG. 12 (FIG. 30 does not show a frequency control signal that serves to control the variable frequency oscillator).

Next, the operation of the receiver according to this exemplary embodiment will be described with a numerical example of the first exemplary embodiment.

Even if frequencies three times and five times higher than the LO frequency lie in the usable bandwidth of the receiver, if it is known that the radio field intensities of interference signals that have such frequencies are sufficiently weak based on the radio field intensity distribution that has been detected before starting communication, with CW1=8, the desired signal can be received without distortion. In other words, LO signal generator 11 may generate an LO signal that has a coarse phase resolution. Thus, the current consumption for signals oscillated by variable frequency oscillator 50 can be suppressed. As another example, if there is a strong interference signal that has a frequency that is four times higher than the frequency of the LO signal, the tap coefficients of the FIR filter are updated with control signal CW2 such that a zero point lies at the frequency of the interference signal. Thus, since strong interference signals are eliminated, the dynamic range of the downstream circuit such as a filter is prevented from being narrowed. In addition, the receiver according to this exemplary embodiment could be applied to a cognitive radio that detects the radio field intensity distribution and can communicate using a non-used bandwidth based on the detected radio field intensity distribution.

(8) Eighth Exemplary Embodiment

Figure 31:
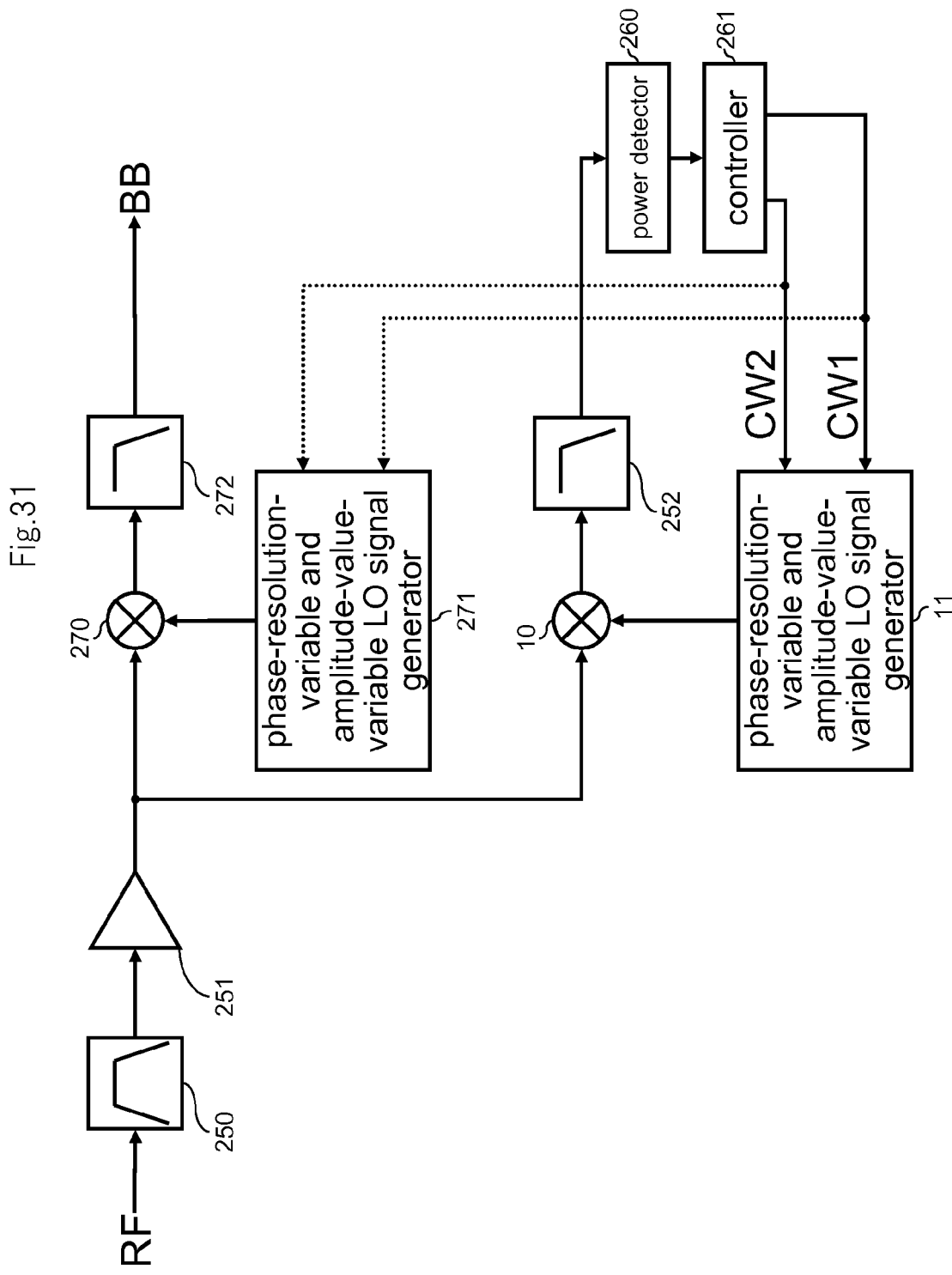
FIG. 31 is a schematic diagram showing the structure of a receiver according to an eighth exemplary embodiment of the present invention.

FIG. 31 shows the structure of a receiver according to an eighth exemplary embodiment of the present invention. The receiver according to this exemplary embodiment is different from the receiver according to the seventh exemplary embodiment in that mixer 270, LO signal generator 271, and channel pass filter 272 are also provided. In the structure of the receiver according to this exemplary embodiment, since the frequencies of LO signal generator 11 can be swept during communication along with the fixed LO frequency of LO signal generator 271, the radio field intensity distribution of the usable bandwidth of the receiver can be detected during communication. A signal (dotted line) that is input from controller 261 to LO signal generator 271 denotes that CW1 and CW2 are updated based on the radio field intensity distribution of the usable bandwidth of the receiver (FIG. 31 does not show a frequency conversion signal that serves to control variable frequency oscillator 50). Thus, an optimum phase resolution and tap coefficients can be designated based on radio field intensity distribution that chronologically varies during communication.

Part or all of the foregoing exemplary embodiments may be described as the following supplementary notes, but not limited thereto.

(Supplementary Note 1)

A frequency converter used for a receiver, comprising:

an LO signal generator that generates an LO signal and outputs the LO signal; and a mixer that multiplies a received signal that has been band-limited in a usable bandwidth of said receiver by the LO signal so as to convert the frequency of the received signal and that outputs the resultant signal, wherein said LO signal generator is capable of varying a phase resolution, and wherein said frequency converter is capable of varying a signal gain for each phase value of the LO signal.

(Supplementary Note 2)

The frequency converter as set forth in supplementary note 1, wherein the phase resolution of said LO signal generator is decided corresponding to the LO frequency of the LO signal.

(Supplementary Note 3)

The frequency converter as set forth in supplementary note 2, wherein if up to $(2N_0-3)$-th order harmonics of the LO signal lie in said usable bandwidth, the phase resolution of said LO signal generator is $180/N$ where N is any integer equal to or greater than $N_0$.

(Supplementary Note 4)

The frequency converter as set forth in supplementary note 3, wherein said N is a power of 2.

(Supplementary Note 5)

The frequency converter as set forth in any one of supplementary notes 1 to 4, wherein the signal gain of said frequency converter for each phase value of the LO signal is decided such that the frequency conversion gain of said frequency converter for an interference signal becomes low.

(Supplementary Note 6)

The frequency converter as set forth in any one of supplementary notes 1 to 5, wherein the signal gain of said frequency converter for each phase value of the LO signal is proportional to a sine value or a cosine value of the phase value.

(Supplementary Note 7)

The frequency converter as set forth in any one of supplementary notes 1 to 5, wherein the signal gain of said frequency converter for each phase value of the LO signal is expressed by a linear function of the phase value.

(Supplementary Note 8)

The frequency converter as set forth in any one of supplementary notes 1 to 5, wherein the signal gain of said frequency converter for each phase value of the LO signal is expressed by binary that comprises 0 and a positive value or binary that comprises 0 and a negative value.

(Supplementary Note 9)

The frequency converter as set forth in any one of supplementary notes 1 to 8, wherein said frequency converter varies the signal gain by controlling the amplitude value of the LO signal for each phase value of the LO signal.

(Supplementary Note 10)

The frequency converter as set forth in supplementary note 9,
wherein said LO signal generator includes:
a variable frequency oscillator;
a phase counter that outputs a phase value corresponding to an output signal of said variable frequency oscillator and a first control signal that serves to vary the phase resolution of said LO signal generator; and
a phase-to-amplitude value converter that outputs an amplitude value that is the LO signal corresponding to the phase value that is output from said phase counter and a second control signal that serves to vary the signal gain of said frequency converter for each phase value of the LO signal to said mixer.

(Supplementary Note 11)

The frequency converter as set forth in supplementary note 10,
wherein said phase counter includes:
a counter that performs a counting operation in synchronization with the output signal of said variable frequency oscillator and outputs the counted result; and
a multiplying unit that multiplies the counted result that is output from said counter by said first control signal and outputs the multiplied result that is said phase value to said phase-to-amplitude value converter.

(Supplementary Note 12)

The frequency converter as set forth in supplementary note 11,
wherein said multiplying unit is a bit shift unit.

(Supplementary Note 13)

The frequency converter as set forth in supplementary note 10,
wherein said phase counter includes:
a counter whose bits vary corresponding to said first control signal, and
wherein said counter performs the counting operation in synchronization with the output signal of said variable frequency oscillator and outputs the counted result that is said phase value to said phase-to-amplitude value converter.

(Supplementary Note 14)

The frequency converter as set forth in supplementary note 10,
wherein said phase counter includes:
an adding unit that adds the phase value that is output from said phase counter and said first control signal and outputs the added result; and
a delaying unit that delays the added result that is output from said adding unit in synchronization with the output signal of said variable frequency oscillator and outputs the resultant signal that is said phase value to said phase-to-amplitude value converter.

(Supplementary Note 15)

The frequency converter as set forth in any one of supplementary notes 10 to 14,
wherein said phase-to-amplitude value converter includes:
a lookup table that stores amplitude values corresponding to individual phase values of the LO signal, converts the phase value that is output from said phase counter to the amplitude value corresponding to the phase value, and outputs the converted amplitude value; and
a digital-to-analog converter that converts the amplitude value that is a digital value and that is output from said lookup table into an analog value and outputs the analog amplitude value that is the LO signal to said mixer,
wherein the amplitude values corresponding to the individual phase values stored in said lookup table are variable corresponding to said second control signal.

(Supplementary Note 16)

The frequency converter as set forth in any one of supplementary notes 1 to 8,
wherein said frequency converter varies the signal gain by controlling the gain of the received signal for each phase value of the LO signal.

(Supplementary Note 17)

The frequency converter as set forth in supplementary note 16,
wherein said LO signal generator includes:
a variable frequency oscillator;
a phase counter that outputs the phase value corresponding to the output signal of said variable frequency oscillator and the first control signal that serves to vary the phase resolution of said LO signal generator; and
a plurality of discrete match detectors that output a binary discrete LO signal to said mixer if they detect that the phase value that is output from said phase counter matches a predetermined phase value, and
wherein said mixer includes:
a plurality of discrete mixers that are located corresponding to said plurality of discrete match detectors and that multiply a discrete LO signal that is output from a corresponding discrete match detector by the received signal, weight the multiplied result with a gain corresponding to a phase of the discrete LO signal, and output the result; and
an adding unit that adds the weighted multiplied results that are output from said plurality of discrete mixers and outputs the added result,
wherein the individual gains of said plurality of mixers are variable corresponding to said second control signal.

(Supplementary Note 18)

The frequency converter as set forth in any one of supplementary notes 10~15 and 17,
wherein the frequency of the output signal of said variable frequency oscillator is a multiple of the LO frequency of said LO signal.

(Supplementary Note 19)

The frequency converter as set forth in supplementary note 18,
wherein the frequency of the output signal of said variable frequency oscillator is a power of 2 of the LO frequency of said LO signal.

(Supplementary Note 20)

A receiver, comprising:
a frequency converter as set forth in any one of supplementary notes 1 to 19; and
a band pass filter that is located upstream of said frequency converter and that limits the bandwidth of the received signal to said usable bandwidth.

(Supplementary Note 21)

The receiver as set forth in supplementary note 20, further comprising:
a channel pass filter that eliminates an interference signal having a frequency that is close to the frequency of a desired signal from an output signal of said frequency converter;
a power detector that detects power of the output signal of said channel pass filter; and
a controller that controls the phase resolution of said LO signal generator and the signal gain for each phase value of the LO signal of said frequency converter corresponding to power of the output signal of said channel pass filter for each LO frequency, the power being obtained by sweeping the LO frequency of the LO signal of said LO signal generator.

(Supplementary Note 22)

The receiver as set forth in supplementary note 21, wherein said receiver includes at least two said frequency converters and at least two said channel pass filters.

The present invention has been described with reference to the exemplary embodiments. However, it should be understood by those skilled in the art that the structure and details of the present invention may be changed in various manners without departing from the scope of the present invention.

The present application claims priority based on Japanese Patent Application JP 2010-147497 filed on Jun. 29, 2010, the entire contents of which are incorporated herein by reference in its entirety.

What is claimed is:

1. A frequency converter used for a receiver, comprising:
an LO signal generator that generates an LO signal and outputs the LO signal; and
a mixer that multiplies a received signal that has been limited to a usable bandwidth of said receiver by the LO signal so as to convert the frequency of the received signal and that outputs the resultant signal,
wherein said LO signal generator is capable of varying a phase resolution,
wherein said frequency converter is capable of varying a signal gain for each phase value of the LO signal, and
wherein said signal gain is determined based on the frequencies and the intensities of interference signals whose frequencies are within said usable bandwidth.

2. The frequency converter as set forth in claim 1, wherein the signal gain of said frequency converter for each phase value of the LO signal is decided such that the frequency conversion gain of said frequency converter for an interference signal becomes low.

3. The frequency converter as set forth in claim 1, wherein the signal gain of said frequency converter for each phase value of the LO signal is proportional to a sine value or a cosine value of the phase value.

4. The frequency converter as set forth in claim 1, wherein the signal gain of said frequency converter for each phase value of the LO signal is expressed by a linear function of the phase value.

5. The frequency converter as set forth in claim 1, wherein the signal gain of said frequency converter for each phase value of the LO signal is expressed by binary that comprises 0 and a positive value or binary that comprises 0 and a negative value.

6. The frequency converter as set forth in claim 1, wherein said frequency converter varies the signal gain by controlling the amplitude value of the LO signal for each phase value of the LO signal.

7. The frequency converter as set forth in claim 6, wherein said LO signal generator includes:
a variable frequency oscillator;
a phase counter that outputs a phase value corresponding to an output signal of said variable frequency oscillator and a first control signal that serves to vary the phase resolution of said LO signal generator; and
a phase-to-amplitude value converter that outputs an amplitude value that is the LO signal corresponding to the phase value that is output from said phase counter and a second control signal that serves to vary the signal gain of said frequency converter for each phase value of the LO signal to said mixer.

8. The frequency converter as set forth in claim 1, wherein said frequency converter varies the signal gain by controlling the gain of the received signal for each phase value of the LO signal.

9. The frequency converter as set forth in claim 8, wherein said LO signal generator includes:
a variable frequency oscillator;
a phase counter that outputs the phase value corresponding to the output signal of said variable frequency oscillator and the first control signal that serves to vary the phase resolution of said LO signal generator; and
a plurality of discrete match detectors that output a binary discrete LO signal to said mixer if they detect that the phase value that is output from said phase counter matches a predetermined phase value, and
wherein said mixer includes:
a plurality of discrete mixers that are located corresponding to said plurality of discrete match detectors and that multiply a discrete LO signal that is output from a corresponding discrete match detector by the received signal, weight the multiplied result with a gain corresponding to a phase of the discrete LO signal, and that output the result; and
an adding unit that adds the weighted multiplied results that are output from said plurality of discrete mixers and outputs the added result,
wherein the individual gains of said plurality of mixers are variable corresponding to said second control signal.

10. A receiver, comprising:
a frequency converter as set forth in claim 1; and
a band pass filter that is located upstream of said frequency converter and that limits the bandwidth of the received signal to said usable bandwidth.

* * * * *